US009672874B2

(12) United States Patent
Ito

(10) Patent No.: US 9,672,874 B2
(45) Date of Patent: Jun. 6, 2017

(54) BUFFER, METHOD FOR CONTROLLING BUFFER, SYNCHRONIZATION CONTROL DEVICE, SYNCHRONIZATION CONTROL METHOD, IMAGE PROCESSING APPARATUS, AND IMAGE PROCESSING METHOD

(71) Applicant: CANON KABUSHIKI KAISHA, Tokyo (JP)

(72) Inventor: Tadayuki Ito, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 284 days.

(21) Appl. No.: 13/945,799

(22) Filed: Jul. 18, 2013

(65) Prior Publication Data

US 2014/0029361 A1 Jan. 30, 2014

(30) Foreign Application Priority Data

Jul. 27, 2012 (JP) .................................. 2012-167044

(51) Int. Cl.
*G11C 7/00* (2006.01)
*G06T 1/60* (2006.01)
(52) U.S. Cl.
CPC . *G11C 7/00* (2013.01); *G06T 1/60* (2013.01)
(58) Field of Classification Search
CPC .................................. G06T 1/60; G11C 7/00
See application file for complete search history.

(56) References Cited

U.S. PATENT DOCUMENTS

| 4,890,226 A * | 12/1989 | Itoh ........................... G06T 1/60 400/279 |
| RE36,211 E * | 5/1999 | Nonomura ..................... 358/434 |
| 6,671,747 B1 * | 12/2003 | Benkual .............. G06F 9/30043 710/1 |
| 2008/0168112 A1* | 7/2008 | Lyons et al. ................... 707/206 |
| 2010/0123937 A1* | 5/2010 | Mori ................ G03G 15/04036 358/1.16 |
| 2015/0156128 A1* | 6/2015 | Moran et al. ................. 370/431 |

FOREIGN PATENT DOCUMENTS

| JP | 2005-169711 A | 6/2005 |
| JP | 2006-165843 A | 6/2006 |
| JP | 4179701 B2 | 11/2008 |
| JP | 2011-070564 A | 4/2011 |
| JP | 2012-098883 A | 5/2012 |

* cited by examiner

*Primary Examiner* — Ibrahim Siddo
(74) *Attorney, Agent, or Firm* — Canon USA, Inc. I.P. Division

(57) ABSTRACT

In a storage device including a plurality of storage regions, in order to synchronize input/output control of data into/from the storage region, a writing sequence or a reading sequence of the data into or from the storage region is stored, one of the storage regions to be accessed is selected in accordance with the stored sequence, and the synchronization control of input/output processing into/from an intermediate buffer is carried out, which allows an intermediate buffer control mechanism to be applied to various intermediate buffers.

11 Claims, 15 Drawing Sheets

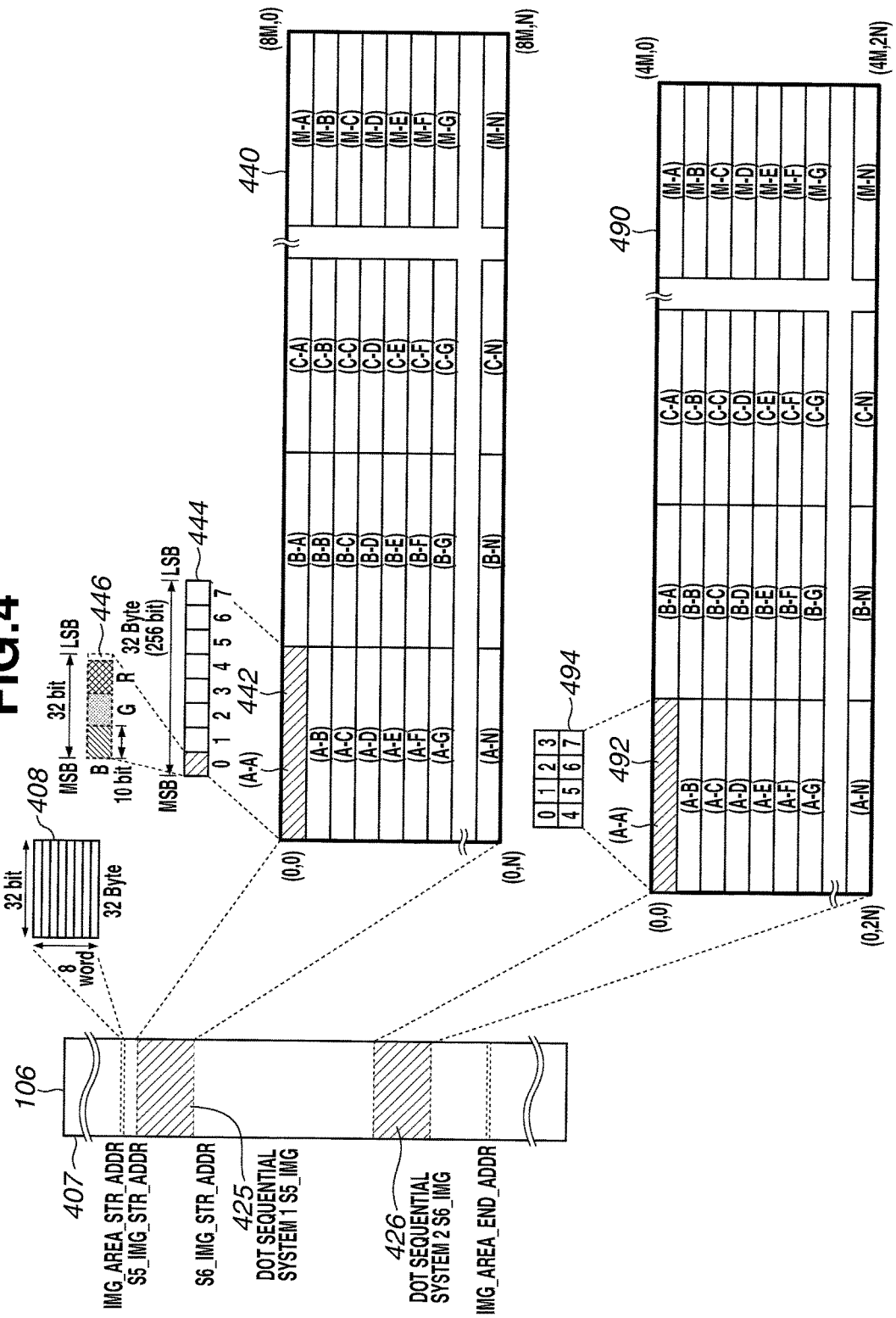

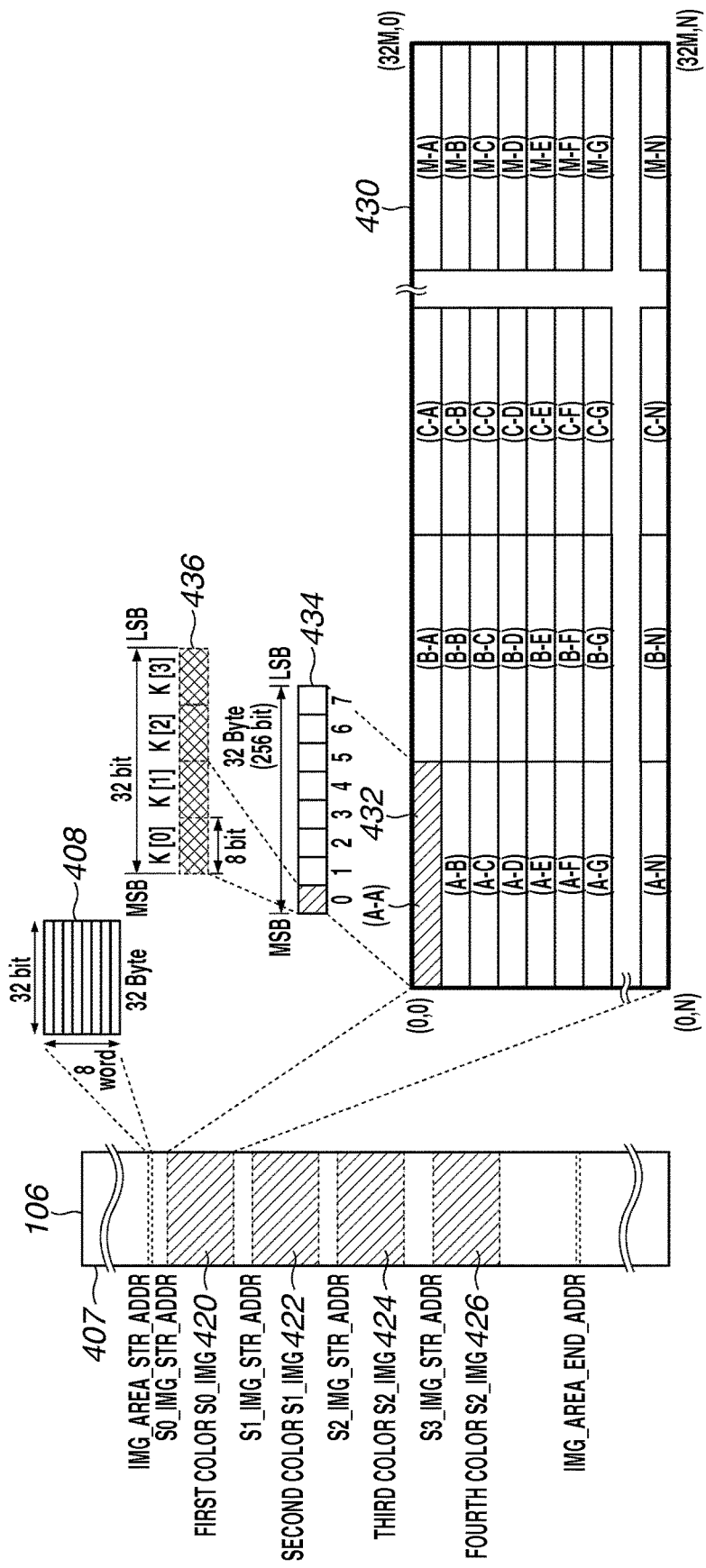

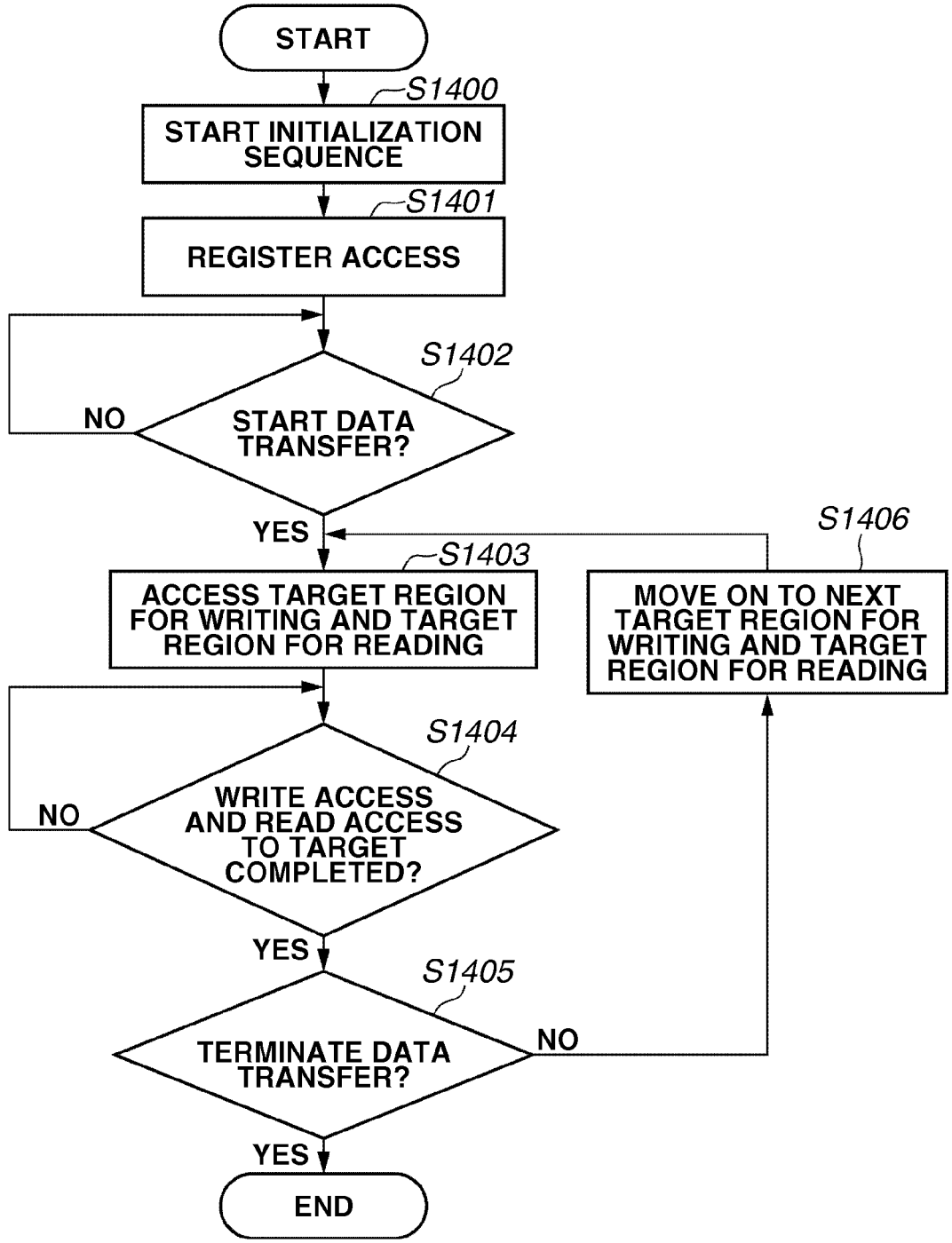

BUFFER, METHOD FOR CONTROLLING BUFFER, SYNCHRONIZATION CONTROL DEVICE, SYNCHRONIZATION CONTROL METHOD, IMAGE PROCESSING APPARATUS, AND IMAGE PROCESSING METHOD

BACKGROUND

Field

Aspects of the present invention generally relate to a buffer, a method for controlling the buffer, a synchronization control device, a synchronization control method, an image processing apparatus, and an image processing method.

Description of the Related Art

Typically, an image processing apparatus includes various components such as a central processing unit (CPU) for controlling the entire apparatus, an external storage device for storing an image to be processed as image data, a direct memory access controller (DMAC) for transferring the image data in each processing unit, and an image processing unit for processing the image. As these components cooperate with one another, desired image processing is realized. The image processing apparatus reads the image data to be processed from the storage device sequentially in unit of a partial image. Then, the image processing apparatus temporarily stores the read partial image in an input buffer of the image processing unit and performs the image processing based on the data stored in the input buffer.

The image processing apparatus temporarily stores data obtained as a result of the image processing into an output buffer of the image processing unit and sequentially writes the data into the external storage device from the output buffer. The image processing apparatus being configured as described above can reduce the capacity of the input buffer or the output buffer by sequentially processing partial images (hereinbelow, also referred to as partial image data), instead of processing the entire image at once.

A general image processing apparatus includes a plurality of intermediate buffers (i.e., input buffer and output buffer) for temporarily storing partial image data so as to simplify the control of the cooperation among the plurality of components. Two intermediate buffers are often provided per transfer unit with a single piece of partial image data serving as one transfer unit. Such a configuration is referred to as a double buffer. This configuration makes it possible to simultaneously write a transfer unit's of data into one of the two intermediate buffers from the storage device and to read stored data from the other intermediate buffer to carry out various processing.

According to a technique discussed in Japanese Patent No. 4,179,701, an image is one-dimensionally divided into regions in a main scanning direction, and then the divided pixel regions are sequentially processed. With this technique, each of the divided pixel regions is further divided into pixel regions, each being defined by a data length in the main scanning direction (i.e., row-wise direction) and a data length in a sub-scanning direction (i.e., column-wise direction), which corresponds to the height of the divided pixel region. Then, this smaller pixel region serves as partial image data and is taken as a transfer unit to be used when image data is read from a storage device such as a dynamic random-access memory (DRAM).

Recently, the number of processing devices to be included into a single product has been increasing, and a processing device (master) that requests data from a storage device has been increasing. In such a case, by increasing the number of intermediate buffers, uninterrupted image processing can be achieved. There is also a need for an intermediate buffer that can flexibly set a data writing sequence into the intermediate buffer and a data reading sequence from the intermediate buffer.

However, if a common circuit (common application specific integrated circuit (ASIC), common board) for a plurality of products, each with a different number of intermediate buffers or with different writing/reading sequences, is to be fabricated using the technique discussed in Japanese Patent No. 4,279,701, a distinct intermediate buffer control mechanism needs to be designed for each number of the intermediate buffers (or for each writing/reading sequence), which may lead to an increase in product cost. For example, if configurations of intermediate buffers (such as the number thereof, the writing/reading sequence in the intermediate buffer) are allowed to be modified, the control for synchronizing writing into and reading from the modified intermediate buffer needs to be modified as well.

SUMMARY

According to an aspect of the present invention, a buffer includes a memory unit including a plurality of regions, a first outputting unit configured to output a first indicator indicating a target region for write access in the order of writing, a second outputting unit configured to output a second indicator indicating a target region for read access in the order of reading, a receiving unit configured to receive data to be written into the memory unit, a writing unit configured to write the data received by the receiving unit into a region indicated by the first indicator output from the first outputting unit, a reading unit configured to read data to be transmitted from a region indicated by the second indicator output from the second outputting unit, a transmitting unit configured to transmit the data read by the reading unit, and, a control unit configured to control the first outputting unit and the second outputting unit to respectively output subsequent indicators upon completion of an access to the memory unit by the writing unit and an access to the memory unit by the reading unit.

Further features of the present invention will become apparent from the following description of exemplary embodiments with reference to the attached drawings.

BRIEF DESCRIPTION OF THE DRAWINGS

FIGS. 2A to 2G are schematic diagrams collectively illustrating a configuration that relates to a series of input/output operations of image data.

FIG. 4 is a schematic diagram illustrating a storage form of image data in a dot sequential system and the data structure.

FIG. 5 is a schematic diagram illustrating a storage form of image data in a frame sequential system and the data structure.

FIG. 14 is a flowchart illustrating an outline of the processing of the image processing apparatus.

DESCRIPTION OF THE EMBODIMENTS

Image Processing Apparatus

First, an overview of an image processing apparatus 101 of a first exemplary embodiment will be described. The image processing apparatus 101 may be an information processing apparatus configured to process image data.

Figure 1A:
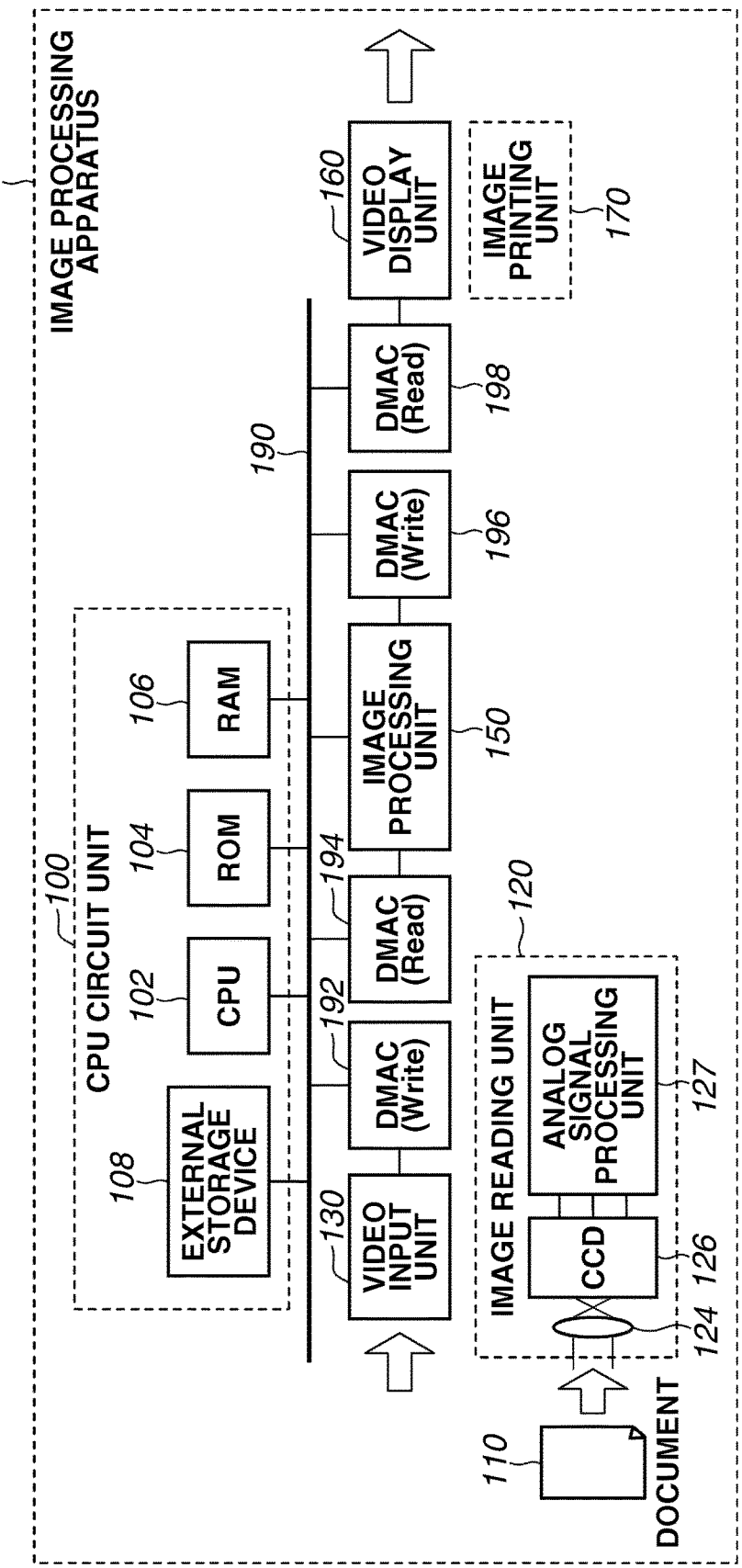
FIG. 1A is a block diagram illustrating an overall configuration of an image processing apparatus.

FIG. 1A is a block diagram illustrating the overall configuration of the image processing apparatus 101 according to the first exemplary embodiment. The image processing apparatus 101 includes a CPU circuit unit 100, an image reading unit 120, and an image processing unit 150.

The image reading unit 120 includes a lens 124, a charge-coupled device (CCD) sensor 126, and an analog signal processing unit 127. In the image reading unit 120, image information of a document 110 is imaged onto the CCD sensor 126 through the lens 124, and the image information is then converted into an analog electrical signal of red (R), green (G), and blue (B) by the CCD sensor 126. The image information that has been converted into the analog electrical signal is input to the analog signal processing unit 127 and subjected to analog to digital conversion (A/D conversion) after having been corrected for each color of R, G, and B. Thus, a digitized full-color digital image signal (pixel value) is generated. The generated digital image signal is input to a video input unit 130, and is then input to a direct memory access controller (DMAC) 192.

The operation of the DMAC 192 is set in advance by a CPU 102, and the DMAC 192 stores the input digital image signal into a random-access memory (RAM) 106 of the CPU circuit unit 100 via a common bus 190. Note that data obtained by putting digital image signals of a plurality of pixels together to form a single image or a partial image region will be referred to as image data in the description to follow. In the present exemplary embodiment, digital image signals are stored into the RAM 106 as image data. When image processing is to be carried out, the CPU 102 starts a DMAC 194 to cause the DMAC 194 to read image data stored in the RAM 106 via a DMA transfer. Then, the CPU 102 causes the DMAC 194 to input a digital image signal that corresponds to a pixel to be processed into the image processing unit 150.

The image processing unit 150 subjects the input digital image signal to, for example, shading correction to compensate individual differences among reading elements in a sensor device such as a scanner and color correction such as input gamma correction, and outputs the processed image data. In addition, the image processing unit 150 may subject the input digital image signal to image processing such as input color correction processing, spatial filter processing, color space conversion, density correction processing, and halftone processing.

Then, a DMAC 196 stores the image data that has been subjected to the image processing by the image processing unit 150 into the RAM 106. The DMAC 196 is controlled, for example, by the CPU 102 pre-setting the operation of the DMAC 196 and starting the DMAC 196. Here, the DMAC 196 is configured, for example, to write the processed image data into the RAM 106 or an external storage device 108 via direct memory access.

A DMAC 198 reads the image data which has been subjected to the image processing and stored in the RAM 106 and outputs the image data to an image printing unit 170. The CPU 102 controls the setting for and starts up of the DMAC 198. The image printing unit 170 includes a print outputting unit (not illustrated) in which, for example, an inkjet head or a thermal head is used. The image printing unit 170 records an image onto a recording medium such as paper based on the digital image signal of the input image data. The present embodiment, however, is not limited to the example in which the image printing unit 170 is used. For example, instead of the image printing unit 170, by using the video input unit 130 and a video display unit 160, an input video image may be subjected to desired image (or video) processing, and the processed video image may be displayed on a display device (not illustrated) such as a display.

The CPU circuit unit 100 includes the CPU 102 for calculation control, a read-only memory (ROM) 104, the RAM 106, and the external storage device 108. The ROM 104 stores fixed data and programs for implementing image processing and buffer control processing, which are described below. The RAM 106 is used to temporarily store data and to load a program. The external storage device 108 includes a hard disk drive (HDD), a solid state drive (SSD), a synchronous dynamic random-access memory (SDRAM), a flash memory, and so on. The external storage device 108 is a storage medium for storing parameters, programs, and correction data to be used by the image processing apparatus 101 according to the present exemplary embodiment, and the data and the programs in the RAM 106 may be loaded from the external storage device 108.

(Image Processing Unit)

Figure 1B:
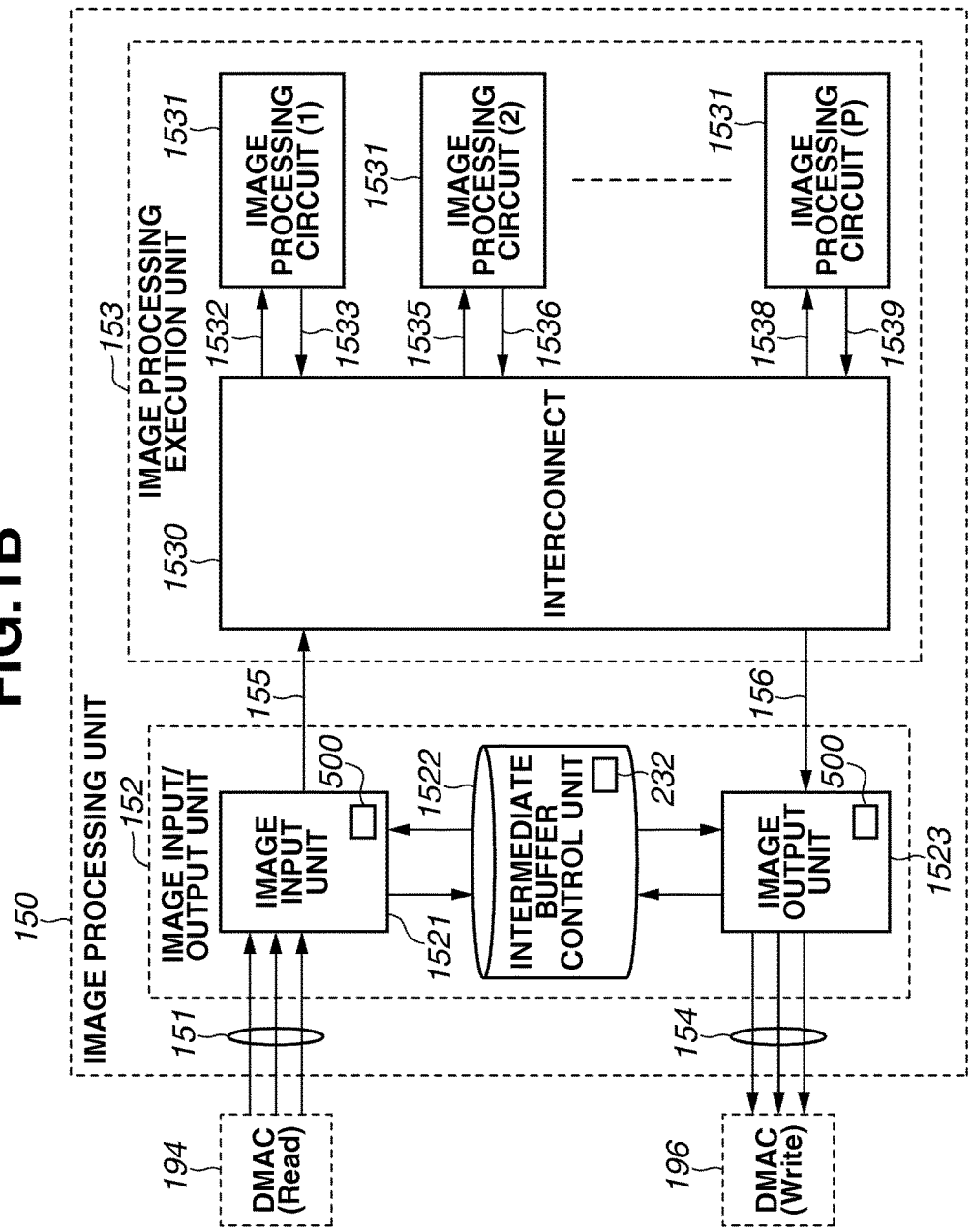
FIG. 1B is a block diagram illustrating a schematic configuration of an image processing unit.

The image processing unit 150 configured to carry out image processing on image data will now be described in detail with reference to FIG. 1B. As illustrated in FIG. 1B, the image processing unit 150 includes an image processing execution unit 153 and an image inputting/outputting unit 152. The image processing execution unit 153 carries out the actual image processing, and the image inputting/outputting unit 152 serves as an interface for the image processing execution unit 153. At a side toward the CPU 102 (i.e., upstream) from the image inputting/outputting unit 152, data is input to or output from the image inputting/outputting unit 152 per transfer unit of a DMAC or per bus width of a system bus. On the other hand, at a side toward the image processing execution unit 153 (i.e., downstream) from the image inputting/outputting unit 152, data is input to or output from the image inputting/outputting unit 152 in a pixel value (one or more pixels constitute(s) a single unit). Thus, the image inputting/outputting unit 152 reduces a difference in processing speed or in transfer speed between the upstream side and the downstream side of the image inputting/outputting unit 152 using a memory unit 232.

An overall operation of the configuration illustrated in FIG. 1B will now be described. First, the CPU 102 starts the DMAC 194, and the DMAC 194 reads image data from the RAM 106. The data structure of the image data will be described below. The DMAC 194 then inputs the read image data to the image inputting/outputting unit 152 of the image processing unit 150 via an input port 151. Upon receiving the image data, an image input unit 1521 (i.e., first receiving unit) of the image inputting/outputting unit 152 stores the received image data into a storage region of the memory unit 232 (hereinbelow, referred to as an intermediate buffer) that is included in an intermediate buffer control unit 1522. Details of the intermediate buffer 232 will be given below. Then, the image input unit 1521 reads the image data stored in the intermediate buffer 232 to extract a pixel value and inputs the extracted pixel value into the image processing execution unit 153 as an input pixel value 155.

The image processing execution unit 153 subjects the input pixel value 155 to predetermined image processing and outputs an output pixel value 156 to the image inputting/outputting unit 152. Details of the image processing execution unit 153 will be given below. Here, each of the input pixel value 155 and the output pixel value 156 is one or more pixel value(s). For example, if the image processing execution unit 153 is to carry out only 3×3 filter processing, the image input unit 1521 inputs a plurality of (e.g., nine) pixel values as the input pixel values 155, and the image processing execution unit 153 outputs a single pixel value as the output pixel value 156 for those given input pixel values 155. Of course, distinct image processing may be assigned to each image processing circuit 1531 and carried out in combination.

In the image inputting/outputting unit 152, an image outputting unit 1523 generates output image data from the processed output pixel value 156 and stores the output image data into the intermediate buffer 232 (i.e., a memory unit) within the intermediate buffer control unit 1522. The image outputting unit 1523 reads the output image data that is temporarily stored in the intermediate buffer 232 and transmits the output image data to the DMAC 196 via an output port 154. As described above, the DMAC 196 has already been started by the CPU 102, and the DMAC 196 writes the received output image data into the RAM 106 (or the external storage device 108).

As described above, the image processing unit 150 reads the image data in the RAM 106 of the image processing apparatus 101 to process the image data and then writes the processed image data back into the RAM 106. Here, the image inputting/outputting unit 152 functions as a data input/output control device for adjusting input and output of data to and from the image processing execution unit 153.

In the configuration illustrated in FIG. 1B, a data synchronization control device 500 is mounted in each of the image input unit 1521 and the image outputting unit 1523 of the image inputting/outputting unit 152, and the data synchronization control device 500 monitors input and output of data into and from the intermediate buffer 232.

(Input and Output of Image Data)

FIGS. 2A to 2G are schematic diagrams collectively illustrating a data flow of a single image data piece stored in the RAM 106. The data flow includes a system for inputting the image data into the image inputting/outputting unit 152 from the RAM 106 and a system for outputting the image data from the image inputting/outputting unit 152 to the RAM 106. The description is first given on a case where dot sequential image data is used.

First, input and output of the image data as illustrated in FIGS. 2A to 2G will generally be described. In the input system of the image data, when the image inputting/outputting unit 152 is to input the image data into the image processing execution unit 153, the image data is once buffered in an input region 234 in the intermediate buffer 232 of the intermediate buffer control unit 1522. Meanwhile, in the output system of the image data, when the image processing execution unit 153 is to output the processed image data to the RAM 106, the image data is once buffered in an output region 236 in the intermediate buffer 232 of the intermediate buffer control unit 1522.

Next, the data flow illustrated in FIGS. 2A to 2G will be described in detail. As illustrated in FIGS. 2A and 2B, the image processing apparatus 101 stores a band region 301 which is a part of image data 300 into the RAM 106 as input image data to be input to the image processing unit 150. Here, band regions (or band images) are obtained by dividing the image data 300 into a plurality of strip-shaped images. The image processing unit 150 sequentially processes the band regions. For example, when an input image with a size of 1092 in height by 1080 in length is to be divided into band regions each with a size of 100 in height by 1080 in length, 20 band regions can be obtained (here, one has a height of 20). In this case, a band memory may be configured to store data with a size of 100 in height by 1080 in length.

The input image data in such a band region has a data structure in blocks of 32 bytes to facilitate handling in the RAM 106. Thus, the input image data in the band region has the data structure of input image data 210 illustrated in FIG. 2C.

In FIG. 2D, the CPU 102 transmits an instruction signal 221 to the DMAC 194. Then, the DMAC 194 reads the input image data 210 in this band region from the RAM 106 via the common bus 190 illustrated in FIG. 1A piece by piece for M small regions and inputs the input image data 210 into the image processing unit 150. The M small regions are obtained by dividing the input image data 210 into M pieces (first small region to M-th small region 211) in units of "32 bytes×Bdh_in" in accordance with the data structure illustrated in FIG. 2C. The DMAC 194 sequentially reads the input image data pieces in the M small regions (serving as a processing unit) and inputs each piece to the image processing unit 150.

The above-described instruction signal 221 from the CPU 102 to the DMAC 194 includes, for example, "starting address of read access target," "consecutive read count (i.e., how many times the data in units of 32 bytes is to be read consecutively)," "increment address," and "repeat count."

For example, with the dot sequential image data in FIG. 4, the instruction signal 211 may include the following.

"Starting Address": S5_IMG_STR_ADDR

"Consecutive Read Count": one time (32 bytes)

"Increment Address": data amount for one line=32 bytes×M

"Repeat Count": height of band region=Bdh_in times

With these settings, the DMAC 194 first reads data by 32 bytes from the starting address S5_IMG_STR_ADDR. Then, to obtain a next piece of data, the DMAC 194 increments the address by 32 bytes×M to skip the data in the first lines in the second to M-th small regions 211, and can read data by 32 bytes in the second line in the first small region 211. The DMAC 194 repeats this processing Bdh_in times. In other words, by reading Bdh_in lines' worth of data in the first small region 211, the DMAC 194 can read the entire data in the first small region 211. Thereafter, when reading data in the second to M-th small regions 211 of the input image data 210, the DMAC 194 is operated with the "starting address" being shifted by 32 bytes each.

The image input unit 1521 of the image inputting/outputting unit 152 receives the input image data from the DMAC 194. Then, the image input unit 1521 transfers the received input image data to the intermediate buffer control unit 1522 using the data synchronization control device 500, which is described below, mounted in the image input unit 1521. The intermediate buffer control unit 1522 includes an intermediate buffer arbitration circuit 230 (i.e., first transmitting unit and second transmitting unit) and the intermediate buffer 232, as illustrated in FIG. 2E. The intermediate buffer 232 includes the input region 234 for storing input image data and the output region 236 for storing output image data. The CPU 102 pre-sets the starting address of the input region 234 of the intermediate buffer 232 as an input region starting address and the starting address of the output region 236 as an output region starting address. The image input unit 1521 first inputs the received input image data into the intermediate buffer arbitration circuit 230.

The intermediate buffer arbitration circuit 230 stores the received input image data into the input region 234 of the intermediate buffer 232. Generally, the intermediate buffer 232 can include one or more storage region(s). For example, in a case where a single storage region is implemented by a single internal storage device (e.g., a single bank in a static random-access memory (SRAM)), the intermediate buffer 232 may include the internal storage devices (e.g., SRAM) which respectively include banks in the number corresponding to the number of storage regions. Further, in a case where the bit length per word in the internal storage device is 256 bits (i.e., 32 bytes), the number of words to be stored in the input region 234 corresponds to the height of the band region, and the number of words turns out to be Bdh_in words, which corresponds to the repeat count of DMA transfers.

Meanwhile, in a case where the bit length per word in the internal storage device is 64 bits (i.e., 8 bytes), four words are required to receive data of 32 bytes long. Accordingly, the number of words to be stored in the input region 234 corresponds to a number obtained by multiplying the height (repeat count of DMA transfers) Bdh_in of the band region by four. In other word, the capacity of the input region 234 corresponds to the capacity to allow input image data of a small region (processing unit), which is a unit for a single DMA transfer, to be stored. Note that upon completion of a DMA transfer or a transfer of input image data in a single band region, the DMAC 194 notifies the CPU 102 of the completion using an interrupt signal 222.

Thereafter, the image input unit 1521 reads the temporarily stored input image data of a small region via the intermediate buffer arbitration circuit 230 and sequentially generates a pixel value per pixel to input the pixel value to the image processing execution unit 153. At this time, the image input unit 1521 may confirm whether the image processing execution unit 153 can receive the next piece of data via a handshake between the image input unit 1521 and the image processing execution unit 153.

The image processing execution unit 153 carries out image processing on an input pixel region that includes one or more pixel(s). For example, the image processing execution unit 153 multiplies a pixel region that includes a plurality of pixels by a predetermined weighting factor and adds all the values to obtain a single output pixel. Further, the image processing execution unit 153 proceeds with the above-described processing while sliding a pixel region in a height-wise direction of the band region. Once the image processing execution unit 153 outputs a pixel value of a single row in the height-wise direction, the image processing execution unit 153 may carry out next processing for outputting a pixel of a subsequent row. The image processing execution unit 153 outputs the processed pixel values pixel by pixel to the image outputting unit 1523 of the image inputting/outputting unit 152.

The image outputting unit 1523 (i.e., a second receiving unit) receives the processed pixel value. Then, the image outputting unit 1523 transfers image data obtained by converting the processed output pixel value to the intermediate buffer control unit 1522 using the data synchronization control device 500, and the intermediate buffer control unit 1522 stores the image data as image data to be output to the external storage device 108.

Here, although the data structure of output image data 250 remains being dot sequential as in FIG. 4, the configuration (i.e., two-dimensional arrangement) of the output image data 250 may be changed from that of the time of input (FIG. 2C), as illustrated in FIG. 2F. This is because the image processing execution unit 153 carries out such image processing in which the size of an input pixel region differs from the size of an output pixel region. As illustrated in FIG. 2F, the height of the output band region of the output image data 250 is Bdh_out, and the length of the band region of the output image data 250 is 8×N.

Since the input image data 210 and the output image data 250 have different heights of the respective band regions, the capacity of a small region (processing unit) 251 may differ from that of the small region 211. This results from the fact that the image processing execution unit 153 includes processing elements such as filter processing and variable magnification processing in which the ratio of input pixels to output pixels is not 1 to 1. Then, as the length of the band region changes, the number of small regions (processing units) 211 also changes from M pieces to N pieces. However, since the input image data 210 and the output image data 250 have the same data structure, the capacity of the output region 236 of the intermediate buffer 232 can be set through the same method as that for the capacity of the input region 234.

The image outputting unit 1523 receives Bdh_out pixels for four rows. When the entire output image data of the first small region 251 is in the output region 236 of the intermediate buffer 232, the image outputting unit 1523 stops receiving the processed output pixel value 156 from the image processing execution unit 153. Then, the image outputting unit 1523 sequentially reads the output image data in the output region 236 and transmits the output image data to the DMAC 196. Subsequently, the DMAC 196 writes the processed image data into the RAM 106 in accordance with an instruction signal 225 (in FIG. 2D) from the CPU 102.

The same operations are repeated until the N-th small region 251, and the output image data of the output band region as illustrated in FIG. 2G is written back into the RAM 106.

Subsequently, processing of the image processing apparatus 101 of the present exemplary embodiment will be described with reference to FIG. 14. In step S1400, upon receiving an instruction to start the apparatus from a user, the CPU 102 starts an initialization sequence. More specifically, the CPU 102 loads a program loader or firmware stored in the ROM 104 for execution.

Then, in step S1401, the CPU 102 writes values loaded from the ROM 104 into a register of each component via register access in accordance with a program of the firmware. Targets of the register access include a control register of each DMAC, a sequence setting register of the data synchronization control device 500 described below, a register (not illustrated) for defining a transfer sequence of the image processing circuits 1531 within an interconnect 1530, and a register indicating processing contents of the image processing circuits 1531. Note that the values to be set by the CPU 102 via the register access may be written into the ROM at a factory prior to being shipped out or may be written into the ROM 104 via the internet or from a storage medium such as a CD-ROM.

In step S1402, the CPU 102 determines whether to start transferring image data to be processed to the image processing unit 150. If the CPU 102 determines to start transferring the image data (YES in step S1402), the CPU 102 carries out the above-described processing to transfer the image data to the DMAC 194 and the DMAC 196.

In step S1403, the image input unit 1521 and the image outputting unit 1523 of the image processing unit 150 access, respectively, a write access target and a read access target in the intermediate buffer 232 to buffer the input/output data. Here, the intermediate buffer 232 typically includes a plurality of storage regions, and each of the image input unit 1521 and the image outputting unit 1523 selects any one of the plurality of storage regions as an access target.

In step S1404, the image input unit 1521 and the image outputting unit 1523 determine whether writing and reading, respectively, for buffering have been completed.

In step S1405, the image input unit 1521 and the image outputting unit 1523 determine whether respective data transfers have been terminated. If the data transfers have not been terminated (NO in step S1405), then in step S1406, the image input unit 1521 and the image outputting unit 1523 transition, respectively, to the next write access target and the next read access target. Then, the image input unit 1521 and the image outputting unit 1523 move to step S1403 to continue with the buffering. Meanwhile, if the data transfers have been terminated (YES in step S1405), the processing is ended.

(Data Synchronization Control Device)

Now, an overview of the data synchronization control device 500 will be given. The data synchronization control device 500 of the present exemplary embodiment is mounted in each of the image input unit 1521 and the image outputting unit 1523. The data synchronization control devices 500 separately monitor a buffering operation of the input system and a buffering state of the output system in the intermediate buffer 232. In the configuration illustrated in FIG. 6, the two data synchronization control devices 500 mounted, respectively, in the image input unit 1521 and the image outputting unit 1523 share the intermediate buffer control unit 1522, the intermediate buffer 232, and the intermediate buffer arbitration circuit 230. Alternatively, the image processing apparatus 101 may include two intermediate buffer control units 1522 respectively for inputting and outputting of image data, and the two data synchronization control devices 500 may not share the intermediate buffer 232, the intermediate buffer control unit 1522, and the intermediate buffer arbitration circuit 230. In this case, the two data synchronization control devices 500 are connected to respectively different intermediate buffer control units 1522.

Subsequently, an overview of the intermediate buffer arbitration circuit 230 of the intermediate buffer control unit 1522 will be given.

The intermediate buffer arbitration circuit 230 mounted in the intermediate buffer control unit 1522 writes image data (buffer_in) received from the image input unit 1521 or the image outputting unit 1523 into one of the storage regions in the intermediate buffer 232 (Write). At this time, the intermediate buffer arbitration circuit 230 buffers image data (transfer unit of DMAC) received from the image input unit 1521 into the input region 234 and buffers pixel data (pixel unit) received from the image outputting unit 1523 into the output region 236. Then, the intermediate buffer arbitration circuit 230 reads the image data stored in a storage region in the intermediate buffer 232. Here, the intermediate buffer arbitration circuit 230 outputs or transmits the image data from the image input unit 1521 to the image processing execution unit 153 in units of one or more pixel(s). As for the pixel data buffered by the image outputting unit 1523, the image outputting unit 1523 converts the pixel data into image data when at least DMAC transfer unit's worth of the pixel data is accumulated and then outputs the image data to the RAM 106 or the external storage device 108 via the DMAC 196.

Here, the data synchronization control device 500 in the image input unit 1521 confirms the writing operation and the reading operation into and from the intermediate buffer 232 in the buffering operation of the input system and then carries out synchronization control. Meanwhile, the data synchronization control device 500 in the image outputting unit 1523 confirms the writing operation and the reading operation into and from the intermediate buffer 232 in the buffering operation of the output system and then carries out synchronization control.

Figure 6:
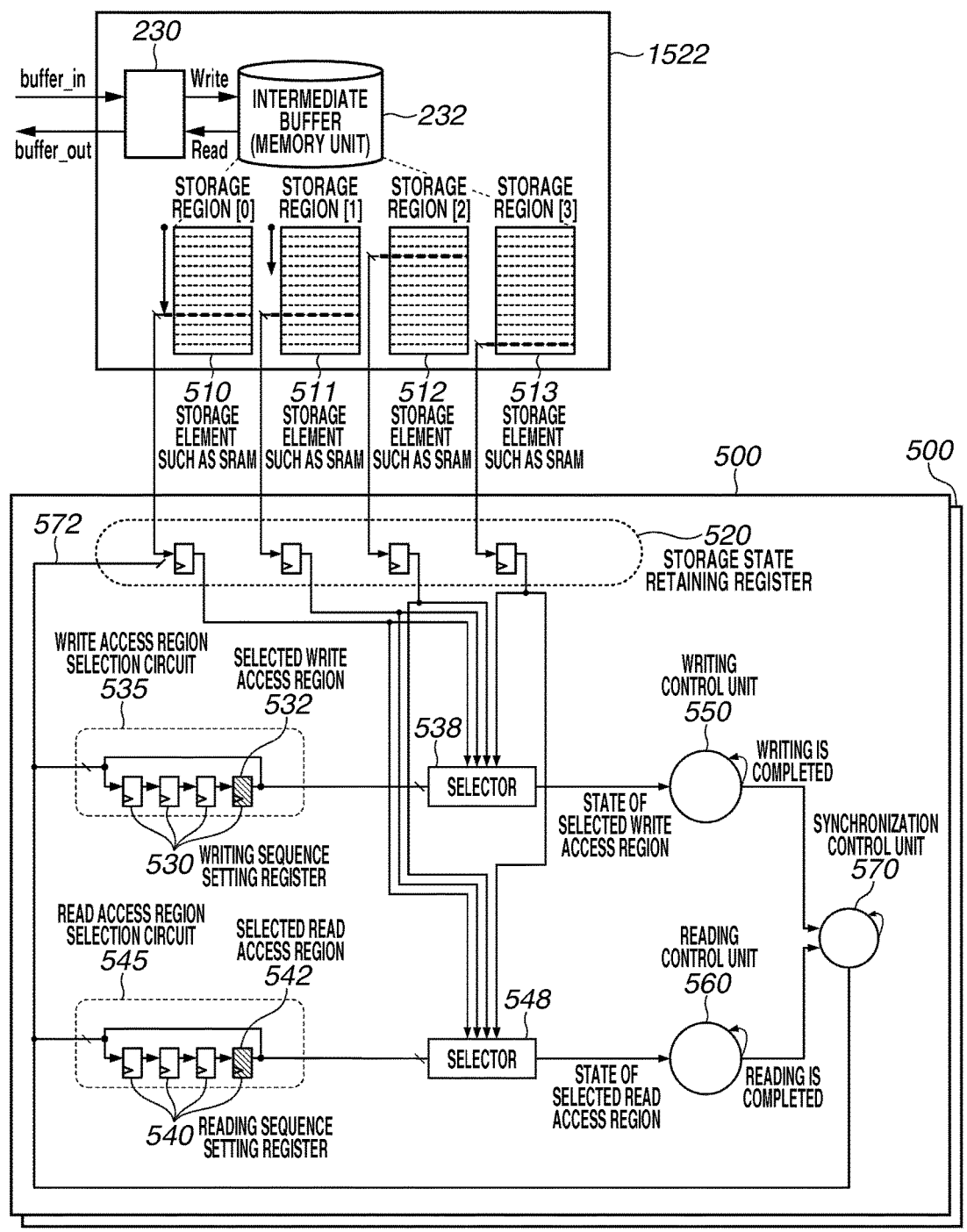
FIG. 6 is a schematic diagram illustrating a configuration for data synchronization control.

Subsequently, the configuration and the operation of the data synchronization control device 500 will be described with reference to FIG. 6. FIG. 6 is a block diagram illustrating a schematic configuration of the data synchronization control device 500. The data synchronization control device 500 mounted in the image input unit 1521 and the data synchronization control device 500 mounted in the image outputting unit 1523 may have the same configuration as each other except in that the settings thereof differ from each other since the input system and the output system deal with different storage regions. The data synchronization control device 500 includes "a configuration, such as a writing sequence setting register 530 and a reading sequence setting register 540, for outputting information pieces such as a bank address indicating which storage regions in the intermediate buffer 232 data is to be written in and read out", and a "configuration for performing synchronization control of the reading system and the writing system such as a synchronization control unit 570, so that the data synchronization control device 500 can carry out the synchronization control.

In the configuration illustrated in FIG. 6, the two data synchronization control devices 500 arranged respectively for the input system and the output system carry out the synchronization control on four storage regions [0]-[3] 510 to 513 of the intermediate buffer 232. Thus, each of the data synchronization control devices 500 includes at least four storage state retaining registers (storage state retaining units) 520 for respectively storing results of monitoring the storage states of the four storage regions. For example, with data to be written into a given storage region being written into that storage region, the synchronization control unit 570 sets a flag indicating being valid in one of the storage state retaining registers 520 that corresponds to the given storage region. Further, with data to be read from a given storage region being read from that storage region, the synchronization control unit 570 sets a flag indicating being invalid in one of the storage state retaining registers 520 that corresponds to the given storage region. In this way, each storage state retaining register 520 stores a flag indicating data storage state of a corresponding storage region. Note that each of the storage state retaining registers 520 stores a flag indicating that no data is stored (i.e., invalid) as the initial value.

The data synchronization control device 500 includes the writing sequence setting register (i.e., a first outputting unit or a third outputting unit) 530 for setting the writing sequence and the reading sequence setting register (i.e., a second outputting unit or a fourth outputting unit) 540. In the writing sequence setting registers 530 and the reading sequence setting registers 540 (i.e., sequence setting units), numbers corresponding to the respective storage regions (i.e., information for identifying individual storage regions, such as values and IDs) are set in accordance with the order in which the storage regions are accessed. For example, in the data synchronization control device 500 of the input system, an indicator (first indicator) of {0×0, 0×1, 0×0, 0×1} is set in the four cascade-connected writing sequence setting registers 530 by the CPU 102, as described above. The indicator is for identifying access targets, and the above settings indicate that the storage regions are accessed sequentially in the order of the storage region [0], the storage region [1], the storage region [0], and the storage region [1]. Further, an example in which an indicator (second indicator) stored in the reading sequence setting registers 540 is set to be the same as that in the writing sequence setting registers 530 will be described. In this case, the storage regions are accessed for reading in the same sequence as in the writing sequence. Meanwhile, the CPU 102 sets an indicator of {0×2, 0×3, 0×2, 0×3} in the writing sequence setting registers 530 and the reading sequence setting registers 540 of the data synchronization control device 500 of the output system.

The data synchronization control device 500 also includes a write access region selection circuit (storage region selection unit) 535 and a read access region selection circuit (storage region selection unit) 545 for selecting the storage regions in accordance with the sequences set in the writing sequence setting registers 530 and the reading sequence setting registers 540.

In the example illustrated in FIG. 6, each of the write access region selection circuit 535 and the read access region selection circuit 545 is a ring-type register, and values stored therein are shifted in accordance with a synchronization signal 572. Accordingly, each of the write access region selection circuit 535 and the read access region selection circuit 545 outputs the values for identifying the storage regions repeatedly in the set order in which the storage regions are accessed. In the example illustrated in FIG. 6, the number stored in registers 532 and 542 indicated with hatches indicate the numbers of the storage regions to be used next (i.e., storage regions selected as access targets). Then, the data synchronization control device 500 obtains values in the storage state retaining registers 520 corresponding to the storage regions selected, respectively, by the write access region selection circuit 535 and the read access region selection circuit 545 using selectors 538 and 548 to confirm the storage state of the selected storage regions.

The synchronization control unit 570 is configured to synchronize a writing control unit 550 (i.e., a first writing unit and a second writing unit) that controls writing into a selected storage region with a reading control unit 560 (a first reading unit, and a second reading unit) that controls reading from a selected storage region. The writing control unit 550 and the reading control unit 560 respectively writes and reads the image data of the above-described small region (transfer unit) into and from a selected storage region along a scanning direction of a DMA transfer or image processing. Upon completion of writing and reading processing of the image data of the small region (transfer unit), each of the writing control unit 550 and the reading control unit 560 notifies the synchronization control unit 570. Here, the synchronization control unit 570 waits until both the reading and the writing of the image data are completed. When both the writing control unit 550 and the reading control unit 560 complete the processing, the synchronization control unit 570 makes the synchronization signal 572 valid to shift the values in the ring-type registers of the write access region selection circuit 535 and the read access region selection circuit 545. Through this, of the writing sequence setting registers 530 and the reading sequence setting registers 540, the state of a selected storage region can be changed from being invalid to valid or from being valid to invalid. In this way, the data synchronization control device 500 synchronizes the writing and the reading of the image data.

Note that the writing sequence setting registers 530 and the reading sequence setting registers 540 do not need to be shift registers. For example, when four sequence setting registers are to be provided, a multiplexer that sequentially selects the four registers in round robin may be provided. If the multiplexer is to be used, a subsequent register may be selected via the synchronization signal 572 from the synchronization control unit 570. In addition, a table that includes the numbers of the storage regions in the order in which the storage regions are accessed may be stored, and the numbers of the storage regions in an entry of the table may be sequentially output.

Further, the values in the writing sequence setting registers 530 and the reading sequence setting registers 540 are written via the register setting by CPU 102 as the CPU 102 executes firmware stored in the ROM 104 at the start of the processing by the image processing apparatus 101. The writing sequence setting registers 530, the reading sequence setting registers 540, and registers (not illustrated) in the image processing circuits 1531 may be arranged in the same register address space. In that case, these registers can be set similarly by the CPU 102. Note that the registers (not illustrated) within the image processing circuits 1531 are parameters that define the processing contents of the respective image processing circuits 1531. Here, although only a single bus route from the DMAC 194 into the image processing unit 150 is illustrated in the configuration illustrated in FIGS. 1A and 1B, commands for setting the registers and image data to be processed may be multiplexed in the single bus route.

(Relationship Between "Storage State of the Storage Region" and "Writing and Reading")

Subsequently, how the storage states of the storage regions [0] to [3] transition with the writing and reading processing by the writing control unit 550 and the reading control unit 560 will be described.

Figure 7:
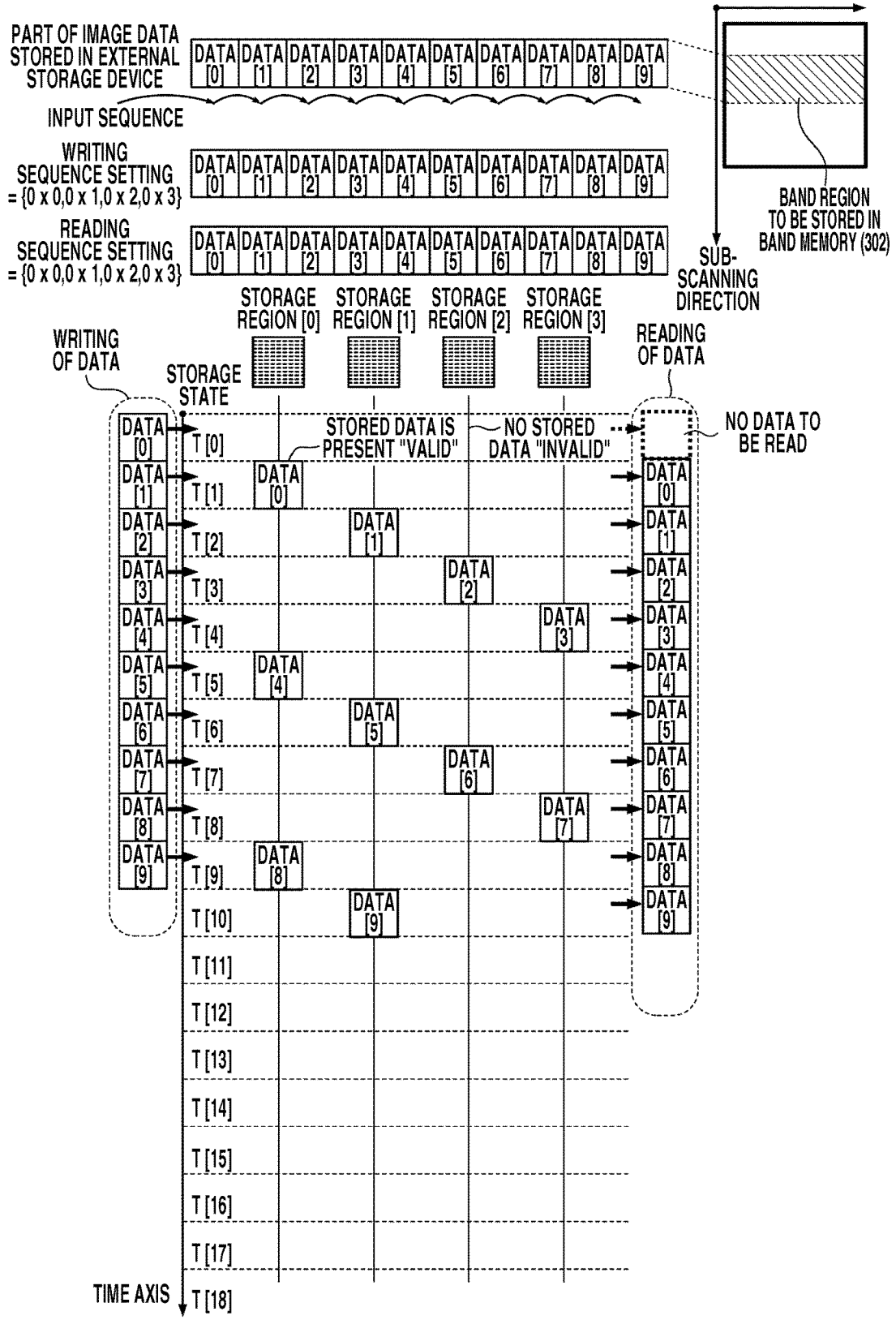
FIG. 7 is a schematic diagram illustrating an operation in the data synchronization control.
Figure 8:
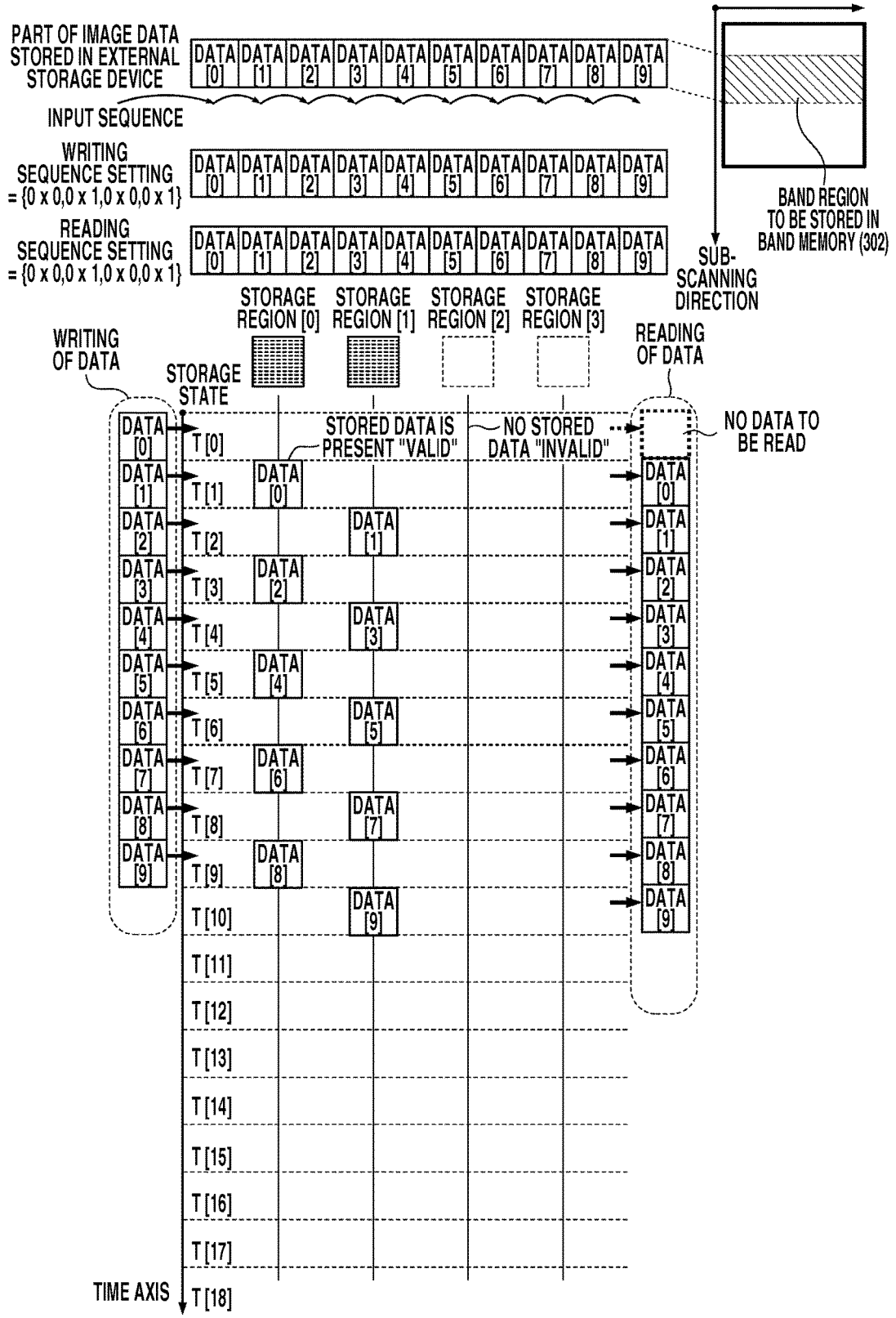
FIG. 8 is a schematic diagram illustrating an operation in data synchronization control with two storage regions.
Figure 9:
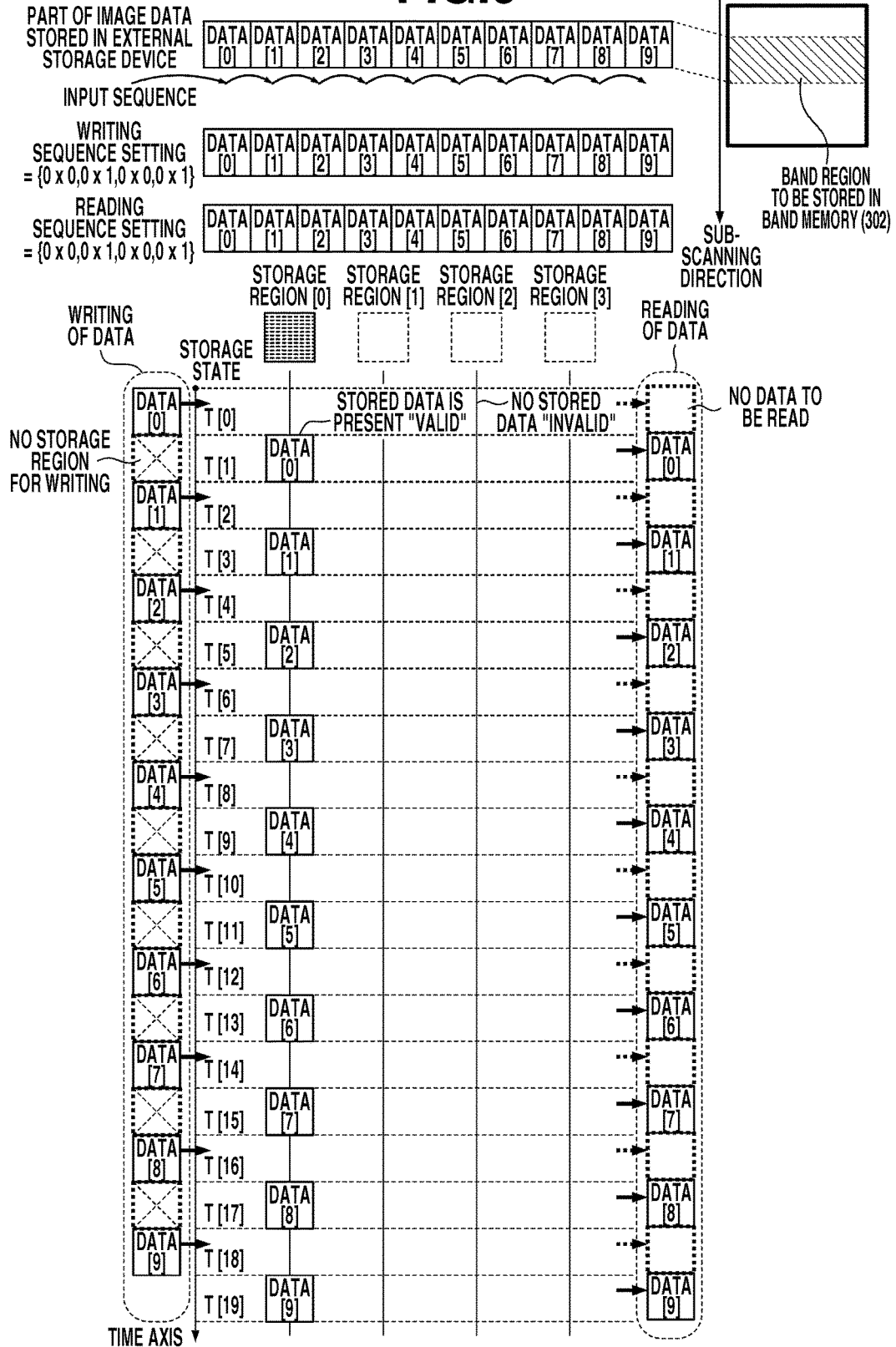
FIG. 9 is a schematic diagram illustrating an operation in data synchronization control with a single storage region.

FIGS. 7 to 9 are schematic diagrams each illustrating how the storage state transitions during writing and reading processing in the configuration illustrated in FIG. 6. In an upper section in each in FIGS. 7 to 9, a relationship between a part of the image data to be written or read and a band region, the writing sequence setting, and the reading sequence setting are illustrated. More specifically, data [0] to data [9] are arranged as the image data that corresponds to a single band region. Each of the data [0] to the data [9] corresponds to the above-described small region (transfer unit). Further, in FIGS. 7 to 9, the data [0] to the data [9] are sequentially input or output from the left end of the band region to the right end thereof.

FIG. 8 illustrates the behavior of the data synchronization control device 500 of the input system. In FIG. 8, the writing sequence setting and the reading sequence setting are configured not to use the storage region [2] and the storage region [3].

In a lower section in FIG. 8, a schematic diagram illustrating the storage states of the respective storage regions is illustrated. In this schematic diagram, the storage region [0] to the storage region [3] are taken on the horizontal axis, and time from time T[0] is taken on the vertical axis. Each segment of the time indicated at the left end of the schematic diagram indicates the timing at which the above-described synchronization signal becomes valid. Further, in the schematic diagram, the data is written from the left end, and the stored data is read from the right end.

At time T[0], the storage state of the storage region [0] that corresponds to {0×0} stored in the writing sequence setting register 532 is "invalid" indicating that no data is stored. Then, the writing control unit 550 externally writes the data [0] into the storage region [0]. Meanwhile, the storage state of the storage region [0] that corresponds to {0×0} stored in the reading sequence setting register 542 is "invalid," and since no data is stored yet, the reading control unit 560 is unable to read data. Here, since the reading control unit 560 does not read any data at time T[0], the synchronization control unit 570 handles as the reading being completed and carries out synchronization processing when the writing is completed. In this synchronization processing, the synchronization control unit 570 shifts the value in the writing sequence setting registers 530 by one, but since no data is read, the synchronization control unit 570 does not shift the value in the reading sequence setting registers 540.

At time T[1], the storage state of the storage region [1] that corresponds to {0×1} stored in the writing sequence setting register 532 is "invalid" indicating that no data is stored, and thus the writing control unit 550 writes the data [1] into the storage region [1]. Meanwhile, the storage state of the storage region [0] that corresponds to {0×0} stored in the reading sequence setting register 542 is "valid" (In FIG. 8, the data [0] is indicated), and thus the reading control unit 560 can read the stored data. Upon being notified of completion of both the writing of the data [1] and the reading of the data [0], the synchronization control unit 570 shifts each of the values in the writing sequence setting register 532 and the reading sequence setting register 542 by one.

Similarly, at time T[2] and on, by carrying out the processing as illustrated in FIG. 8, the image data including the data [0] to the data [9] can be input and output.

In the example illustrated in FIG. 8, by setting the setting values of the writing sequence setting and the reading sequence setting to {0×0, 0×1, 0×0, 0×1}, the number of apparent storage regions are set to two. Since {0×2} and {0×3} are not included in the values of the sequence settings, the storage region [2] and the storage region [3] are not used. For example, even when designing an ASIC that includes only two storage regions within the intermediate buffer 232, that case can be handled only by changing the settings in the sequence setting registers in the data synchronization control device 500. In the data synchronization control device 500 of the output system, by setting the setting values of the writing sequence setting and the reading sequence setting to {0×2, 0×3, 0×2, 0×3}, the storage region [0] and the storage region [1] are not used. Here, the behavior of the input system and the storage regions to be accessed differ from those of the example illustrated in FIG. 8, but the behavior of the output system is the same as that illustrated in FIG. 8. As apparent from the schematic diagram illustrated in FIG. 8, in the data synchronization control device 500 of the input system and the data synchronization control device 500 of the output system, merely the storage regions to be accessed change, but the synchronization control devices 500 and the logic configuration of the intermediate buffer control unit 1522 do not need to be modified.

Subsequently, the behavior in the case where the data synchronization control device 500 illustrated in FIG. 6 is applied to a mode in which the intermediate buffer 232 and the intermediate buffer arbitration circuit 230 are provided for each of the input system and the output system will be described with reference to FIG. 7. Note that if each storage region in the intermediate buffer 232 is divided into the input region 234 for the input system and the output region 236 for the output system as illustrated in FIG. 2E, the synchronization control devices 500 of the input system and the output system can both access the entire storage regions.

In the example illustrated in FIG. 7, since the writing sequence setting and the reading sequence setting are both set to {0×0, 0×1, 0×2, 0×3}, the storage regions are selected as access targets in the sequence of the storage region [0], the storage region [1], the storage region [2], the storage region [3], the storage region [0], . . . , and so forth.

FIG. 9 is a schematic diagram illustrating a case where the number of storage regions is set to one. In this example, the setting values of the writing sequence setting and the reading sequence setting are set to {0×0, 0×0, 0×0, 0×0}. Since {0×1}, {0×2}, and {0×3} are not included in the values of the sequence settings, the storage region [1], the storage region [2], and the storage region [3] are not used. The processing illustrating in FIG. 9 can also be realized only by changing the sequence settings in the configuration illustrated in FIG. 6.

However, if the number of storage regions is set to one as in FIG. 9, writing processing (buffer_in) and reading processing (buffer_out) share the same storage region [0], and thus only one processing can be carried out at one time. Accordingly, time it takes to input and output the image data including the data [0] to the data [9] is greatly increased in comparison with the cases in FIGS. 7 and 8.

Note that the examples in FIGS. 8 and 9 can be applied in both cases where the intermediate buffer control unit 1522 is provided for each of the input system and the output system and where the intermediate buffer control unit 1522 is provided commonly for the input system and the output system.

(Image Processing Execution Unit)

Now, the image processing execution unit 153 of the image processing unit 150 will be described in detail. The image processing execution unit 153 includes the P pieces of the image processing circuits 1531 including a first image processing circuit to a P-th image processing circuit and the interconnect 1530 that connects the P image processing circuits 1531. The P pieces of the image processing circuits 1531 are connected with the interconnect 1530 via input ports 1532, 1535, and 1538 and output ports 1533, 1536, and 1539. Each of the ports multiplexes data and commands (e.g., parameters for determining the image processing contents by the image processing circuits 1531) and transmits the result.

The image processing circuits 1531 carry out processing pertaining to at least one of input color correction processing, color space conversion, density correction processing, halftone processing, spatial filter processing, resolution conversion, trimming processing, end expansion processing, interlace-to-progressive (IP) conversion, and chroma upsampling, for example. Each of the image processing circuits 1531 may be realized with hardware logic such as a pipelined circuit or may be realized by a processor executing a program (software). The image processing circuits 1531, for example, receive the input pixel value 155 via the input ports 1532, 1535, and 1538, and after processing the input pixel value 155, the image processing circuits 1531 output the processed output pixel value 156 via the output ports 1533, 1536, and 1539.

The interconnect 1530 is realized with a connecting unit such as a crossbar and a ring bus and can switch the image processing circuits 1531 to which the input ports 1532, 1535, and 1538 and the output ports 1533, 1536, and 1539 are connected as desired. Accordingly, as the CPU 102 sets in the register of the interconnect 1530 the designated image processing circuits 1531 to which the input ports 1532, 1535, and 1538 and the output ports 1533, 1536, and 1539 are to be connected, the interconnect 1530 can, for example, change the execution sequence of the P pieces of the image processing circuits 1531 or bypass (skip) a part of the processing. In this way, the image processing execution unit 153 can select and combine various processing to realize desired image processing in accordance with an application.

(Division of Regions)

Next, division of the image data into regions in the present exemplary embodiment will be described. According to the present exemplary embodiment, band processing which is one of the methods for dividing image data into regions is used. Hereinbelow, the band processing will be described with reference to FIGS. 3A to 3S. As illustrated in FIGS. 3A to 3D, in the band processing, a single piece of image data 300 is divided into belt-shaped band regions 301 to 304, and various image processing is carried out on each of the band regions 301 to 304. Note that band regions are obtained by dividing image data into belt-shaped regions either in the main scanning direction or in the sub-scanning direction, and the band regions and the image data have the same length either in the main scanning direction or in the sub-scanning direction.

For example, in FIGS. 3A to 3D, the image data 300 is divided in the sub-scanning direction, and the image data 300 and the band regions 301 to 304 have the same length in the main scanning direction but different lengths in the sub-scanning direction. Hereinbelow, each of the divided elongated regions is referred to as a band region, an address region in which the band region is expanded is referred to as a band memory, and an act of dividing image data is referred to as a band division. The band memory may be secured in the RAM 106 or in an appropriate storage region in the system. Here, for the sake of simplicity, a case where the band memory is secured in the RAM 106 will be illustrated as an example.

Figure 3A:
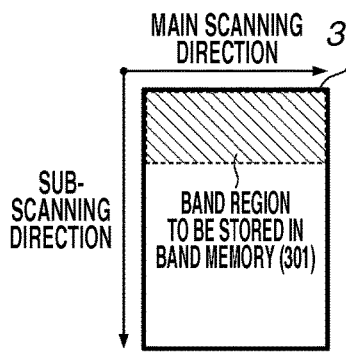
FIGS. 3A to 3H and 3P to 3S are schematic diagrams illustrating band images to be used in band processing.
Figure 3B:
Figure 3C:
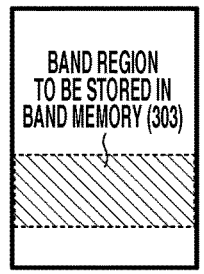
Figure 3D:
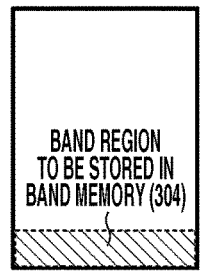
Figure 3E:
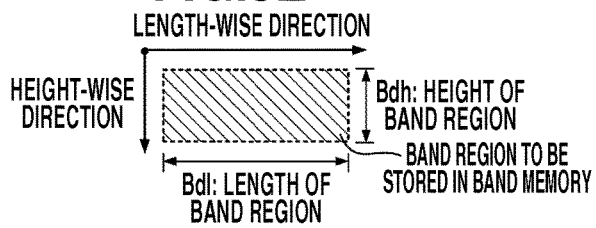

Further, hereinbelow, the coordinate system (main scanning direction-sub-scanning direction) of the image data is newly defined with a coordinate system of the length-wise direction and the height-wise direction (band region coordinate system), and the size of the band region is expressed in "length×height," as illustrated in FIG. 3E. The length of the band region, that is, the size of the band region in the length-wise direction takes on a value of either the length of the image data in the main scanning direction or the length in the sub-scanning direction. Further, the height of the band region, that is, the size of the band region in the height-wise direction takes on an arbitrary value. For example, in FIGS. 3A to 3D, the length-wise direction corresponds to the main scanning direction, and the height-wise direction corresponds to the sub-scanning direction. On the other hand, in a case where the image data is divided in the main scanning direction, for example, as illustrated in FIGS. 3P and to 3R, the length-wise direction corresponds to the sub-scanning direction, and the height-wise direction corresponds to the main scanning direction, as illustrated in FIG. 3S. The band division as illustrated in FIGS. 3P to 3R may be carried out in a case where the image data is larger is the main scanning direction than in the sub-scanning direction, for example.

In the band processing, first, the first band region 301 illustrated in FIG. 3A is expanded in a band memory in the RAM 106 to carry out the image processing thereon, and the processing result is written back into a storage region in the RAM 106 in other than the band memory. Then, the second band region 302 illustrated in FIG. 3B is expanded in the band memory where the first band region 301 has been expended to overwrite the band memory in the RAM 106 to carry out the image processing thereon. Similarly, the third band region 303 illustrated in FIG. 3C and the fourth band region 304 illustrated in FIG. 3D are expanded to overwrite the band memory to carry out the image processing thereon. As apparent from FIGS. 3A to 3D, the first to fourth band regions 301 to 304 have the same length but do not need to have the same height. Accordingly, the height of a band memory to be secured in a main memory is determined by the height of the highest band region (in the case of FIGS. 3A to 3S, the first to third band regions 301 to 303).

Figure 3F:
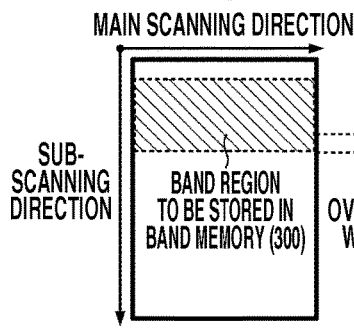
Figure 3G:
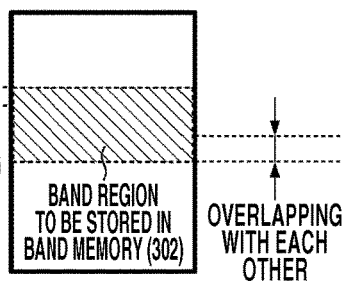
Figure 3H:
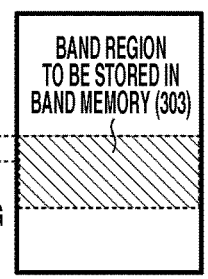
Figure 3P:
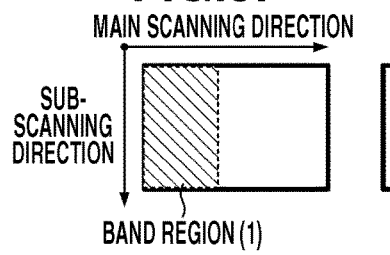
Figure 3Q:
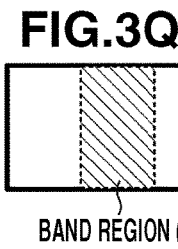
Figure 3R:
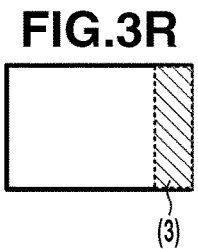
Figure 3S:
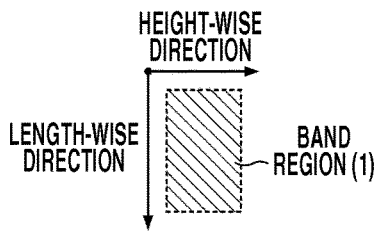

Note that local (proximal) image processing such as spatial filter processing is carried out between adjacent band regions without any gap therebetween in the band processing, and thus each band region partially overlaps with an adjacent band region at their boundaries as illustrated in FIGS. 3F to 3H. Then, by scanning pixel by pixel in the same direction as the height of each band region, the capacity of a delay memory for storing processing pixels required for the local (proximal) image processing is defined by the height of each band region. By carrying out the processing for each band region as described above, the delay memory required for the local (proximal) image processing can be saved.

(Data Structure of Dot Sequential Image Data)

Subsequently, an example of the data structure of dot sequential image data will be described in detail. According to the present exemplary embodiment, the image data is temporarily stored in the RAM 106, as described above. The RAM 106 is often constituted by an inexpensive DRAM. Accordingly, in a case where image data is written into or read from a DRAM via a DMAC as described above, the image data is desirably handled in a unit (access unit) that allows the image data to be written or read without degrading the DRAM performance. Thus, an example of the method for storing the image data into the RAM 106 (the description to follow assumes that a DRAM is used as the RAM 106) and an example of the data structure of the image data will be described in detail with reference to FIG. 4. FIG. 4 illustrates a state in which data is stored in the RAM 106. In the example illustrated in FIG. 4, a data region 407 (a region from IMG_AREA_STR_ADDR to IMG_AREA_END_ADDR) is secured prior to starting the image processing, and various image data pieces necessary for the image processing are stored in the data region 407.

FIG. 4 illustrates an example of storing the dot sequential image data into the RAM 106, and two pieces of image data S5_ING 425 and S6_ING 426 are stored in the data region 407 of the RAM 106. In this example, in order to allow the image data to be written and read without degrading the DRAM performance, the minimum unit of the capacity of the image data to be stored is 32 bits×8 words, or 32 bytes, as indicated in 408 in FIG. 4. In other words, the storage capacity (capacity on the DRAM) for the image data S5_IMG 425 and S6_IMG 426 turns out to be an integral multiple of 32 bytes. Here, according to how the RAM 106 is configured in the image processing apparatus 101, the type of the memory unit (DRAM, SDRAM, DDR, and so on) for implementing the RAM 106, the bus width of the memory bus, the type of image processing to be carried out, and so forth, the unit for writing and reading the image data does not need to be 32 bytes. For example, if the unit for writing and reading the image data is changed, the method for calculating the capacity of the intermediate buffer for storing the image data may be changed.

The data structure of the dot sequential image data will now be described in detail. Image data 440 has the structure of the dot sequential and includes pixel values of red (R), green (G), and blue (B), respectively. Hereinbelow, a combination of the pixel values of RGB will be referred to as a single pixel value. A region 442 contained in the image data 440 is data of 32 bytes, and a plurality of (e.g., eight) pixel values are packed within the region 442, as indicated in data 444. Further, in each of the eight pixel values contained in the data 444, values of R, G, and B of 10 bits each are packed as indicated in data 446. In the example illustrated in FIG. 4, the remaining two bits are invalid data (reserved region) for facilitating an access to the DRAM, and no data is stored therein (i.e., always being 0). The image data 440 defined by a thick line in FIG. 4 has a size of 8M×N pixels. Although the data region 442 of 32 bytes with one pixel in the vertical direction by eight pixels in the horizontal direction is defined in the example illustrated above, a data region 492 with two pixels in the vertical direction by four pixels in the horizontal direction as indicated in image data 494 may also be defined.

(Data Structure of Frame Sequential Image Data)

Subsequently, an example of the data structure of frame sequential image data will be described with reference to FIG. 5. In the example illustrated in FIG. 5, four pieces of image data S0_IMG 420 to S3_IMG 426 are stored in the data region 407 of the RAM 106. These four pieces of image data S0_IMG 420 to S3_IMG 426 have been obtained by subjecting an image read by the image reading unit 120 to color space conversion or density correction processing and by converting the processed image into four monotone images, respectively, of a first color black (K), a second color magenta (M), a third color cyan (C), and a fourth color yellow (Y). Then, in order to allow the image data to be written and read without degrading the DRAM performance, the minimum unit of the capacity of each piece of the image data to be stored is 32 bytes (32 bits×8 words), similarly to the dot sequential image data. The data storage capacity of the image data S0_IMG 420 to S3_IMG 426 is also an integral multiple of 32 bytes as in the dot sequential image data described above.

Next, the data structure of the frame sequential image data will be described in detail. Image data 430 is the image data of the first color black (K) in the above-described region S0_IMG 420. A region 432 of the image data 430 is data of 32 bytes as described above, and eight pieces of 32 bit long data 434 are packed therein. Further, a single piece of 32 bit long data 434 includes four pieces of 8 bit long data 436 for the color component of black (K). The range defined by the thick line or the image data 430 in FIG. 5 has the size of 8×4×M×N. The data structures of the image data of the second to fourth colors are similar to the above, and thus the description thereof will be omitted.

(Input and Output Method of Frame Sequential Image Data)

The above description has been given using the dot sequential image data for the sake of simplicity. Next, a method for inputting the frame sequential image data as illustrated in FIG. 5 into the image processing unit 150 from the RAM 106 and outputting the processed image data from the image processing unit 150 will be described.

When the image processing is carried out on the frame sequential input image data, the four pieces of image data respectively in the first to fourth colors need to be read from the RAM 106 per small region (processing unit). Accordingly, unlike the case of the dot sequential image data, the DMA transfer is carried out four times with different "starting addresses" for the respective small regions of the same position of the four images. More specifically, for the image data corresponding to a first small region, the DAM transfer is carried out four times to the DMAC 194 with the following four starting addresses being sequentially switched.

"Starting Address (first time)": S0_IMG_STR_ADDR in FIG. 5

"Starting Address (second time)": S1_IMG_STR_ADDR in FIG. 5

"Starting Address (third time)": S2_IMG_STR_ADDR in FIG. 5

"Starting Address (fourth time)": S3_IMG_STR_ADDR in FIG. 5

Then, the image input unit 1521 temporarily stores the four pieces of image data read by the DMAC 194 into the intermediate buffer 232. Thereafter, the image input unit 1521 reads the four color components at predetermined positions (coordinates) of the four pieces of image data and inputs the read four color components collectively as a single dot sequential pixel value (C, M, Y, K) into the image processing execution unit 153. Further, when the image outputting unit 1523 stores the dot sequential pixel value (C, M, Y, K) processed by the image processing execution unit 153 into the intermediate buffer 232, the image outputting unit 1523 stores the four color components in respectively different regions within an output region, and thus the frame sequential output image data is obtained. Of course, similarly to the reading of the input image data, the DMA transfer is carried out four times for writing the output image data into the RAM 106.

As described thus far, with the present exemplary embodiment, even when the configuration (the number of frames or the writing/reading sequence) of the intermediate buffer 232 is changed, the synchronization control on the writing into and the reading from the intermediate buffer 232 is possible, and thus, the configuration of the intermediate buffer 232 can be set and modified with a simple configuration.

Accordingly, the writing sequence of the image data into the intermediate buffer 232 and the reading sequence of the image data from the intermediate buffer 232 can be set independently from each other. Further, the number of frames of the intermediate buffer 232 can be modified as desired. For example, using two settings, the number of storage regions to be used for writing and reading of the data can be set from "n" (n is an integer equal to or greater than 2) to "m" (m is a natural number smaller than n). Accordingly, by using n pieces of the storage regions in a high-functionality product and using m pieces of the storage regions in a low-priced product, the number of memories such as an SRAM constituting the intermediate buffer 232 can be reduced to reduce the circuit size. At this time, the same data synchronization control device 500 for controlling the intermediate buffer 232 may be used, and thus two different types of data synchronization control devices with distinct logic designs do not need to be designed. In this way, only by changing the settings for the writing sequence and the reading sequence, the number of storage regions in the intermediate buffer 232 to be connected to the data synchronization control device 500 can be optimally modified, and the storage capacity of the intermediate buffer 232 can be optimized. Further, with the present exemplary embodiment, a trade-off between the speed of input/output of the image data and the circuit size can be realized.

Further, in a high-functionality product that includes n pieces of the storage regions in the intermediate buffer 232, if the operation speed may be reduced, the number of storage regions used in the intermediate buffer 232 for temporarily inputting or outputting data can be changed to m pieces. Then, the remaining storage regions may flexibly be assigned to other use in the image processing, and thus the storage regions in the intermediate buffer 232 can be used efficiently. Here, examples of the other use include a delay memory for storing peripheral pixels necessary for filter processing in an image processing circuit that carries out the filter processing, a look-up table (LUT) storing unit for storing an LUT in an image processing circuit that carries out color conversion, a data cache, and the like. Note that the image processing circuit to be used for the other use may be connected to another port of a controller of an SRAM to be used in the intermediate buffer 232 via a signal line distinct from the interconnect 1530.

Subsequently, an example where data pieces are rearranged in a buffer based on setting values of the writing sequence setting and the reading sequence setting will be described.

Figure 10:
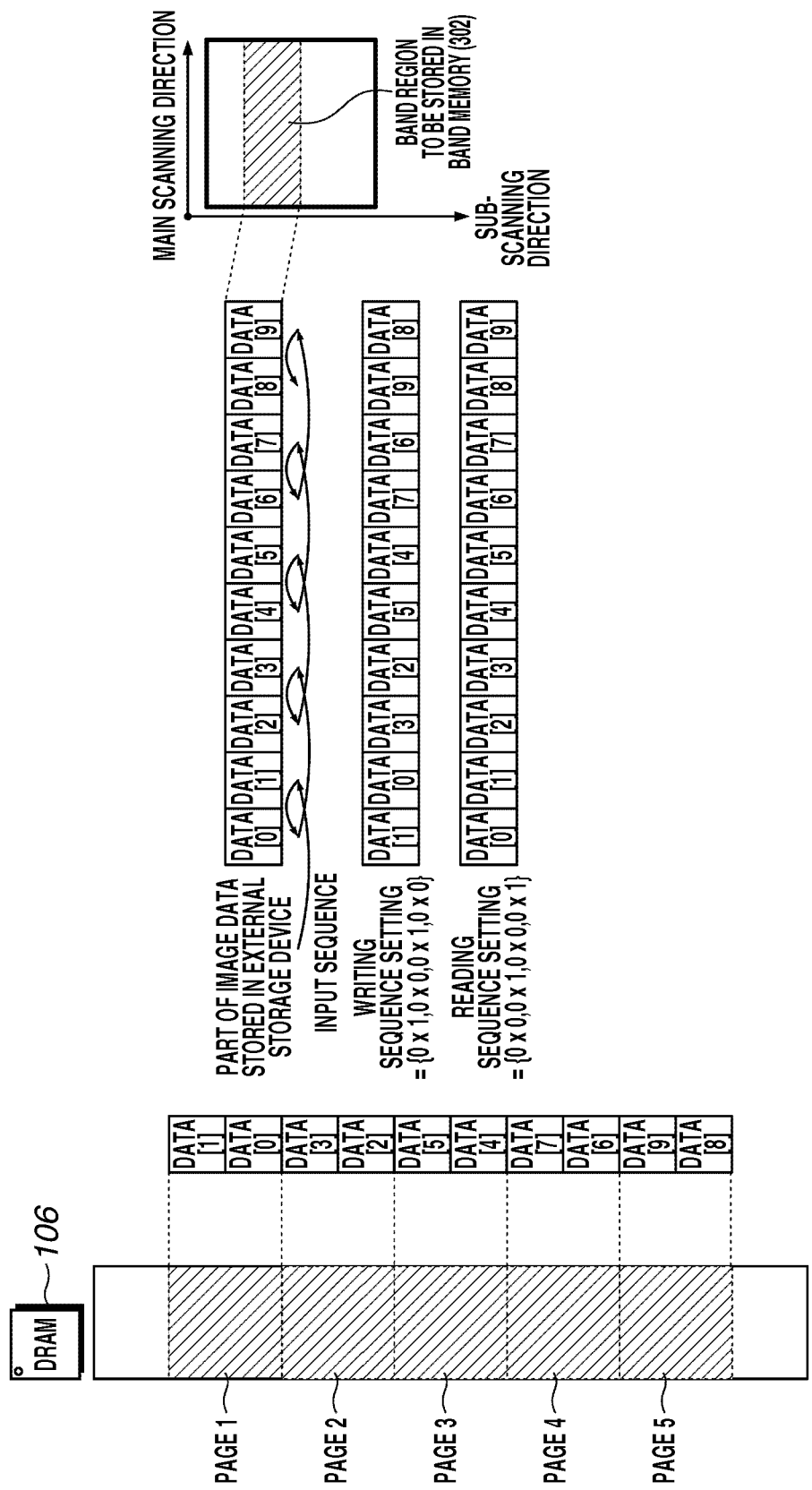
FIG. 10 is a schematic diagram illustrating a storage form of data on a page by page basis.

FIG. 10 illustrates a state in which image data is stored in an external storage device with data pieces thereof being rearranged, for example, part of the image is flipped horizontally, due to the previous processing or other devices (e.g., due to the configuration of the CCD 126 in the image reading unit 120). A DRAM is used as the external storage device, and an image data piece required for the image processing is stored in each page in the DRAM (i.e., the same row address in the DRAM). The DRAM such as an SDRAM can efficiently read data though a burst access to the data per page. Accordingly, it is desirable to read a page's worth of image data continuously for the sake of efficiency.

In the example illustrated in FIG. 10, the DMAC reads image data pieces of small regions (transfer unit) continuously in the order of data [1] and data [0]. However, since the image processing needs to be carried out in the order of the data [0] and the data [1], the image input unit 1521 needs to rearrange the data pieces.

With the data synchronization control device 500 according to the present exemplary embodiment, the above situation can be handled flexibly simply by modifying the setting values of the above-described writing sequence setting as follows.

Writing sequence setting when four storage regions are used={0×1, 0×0, 0×3, 0×2}

Writing sequence setting when two storage regions are used={0×1, 0×0, 0×1, 0×0}

Figure 11:
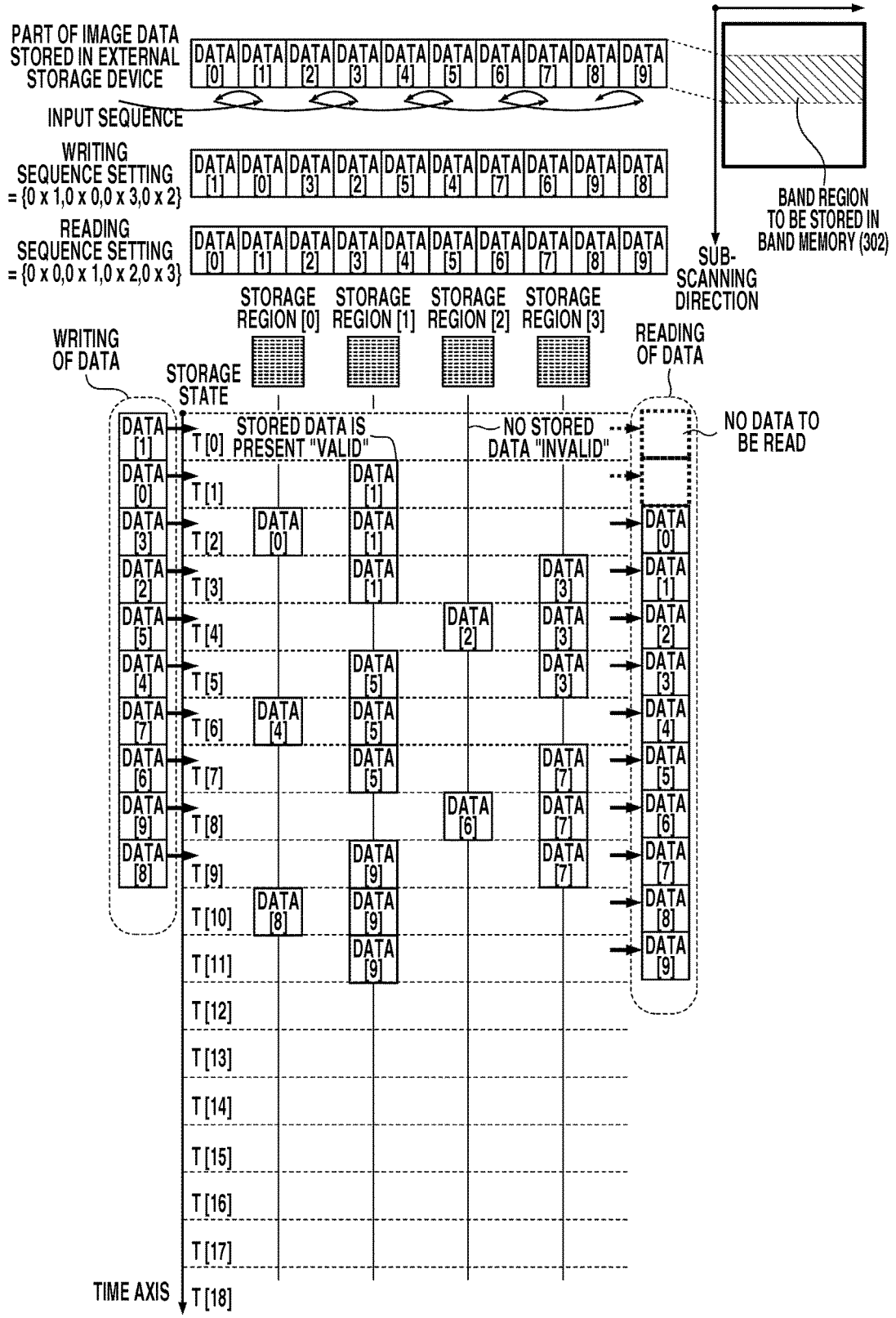
FIG. 11 is a schematic diagram illustrating an operation in data synchronization control in buffering that includes rearrangement.
Figure 12:
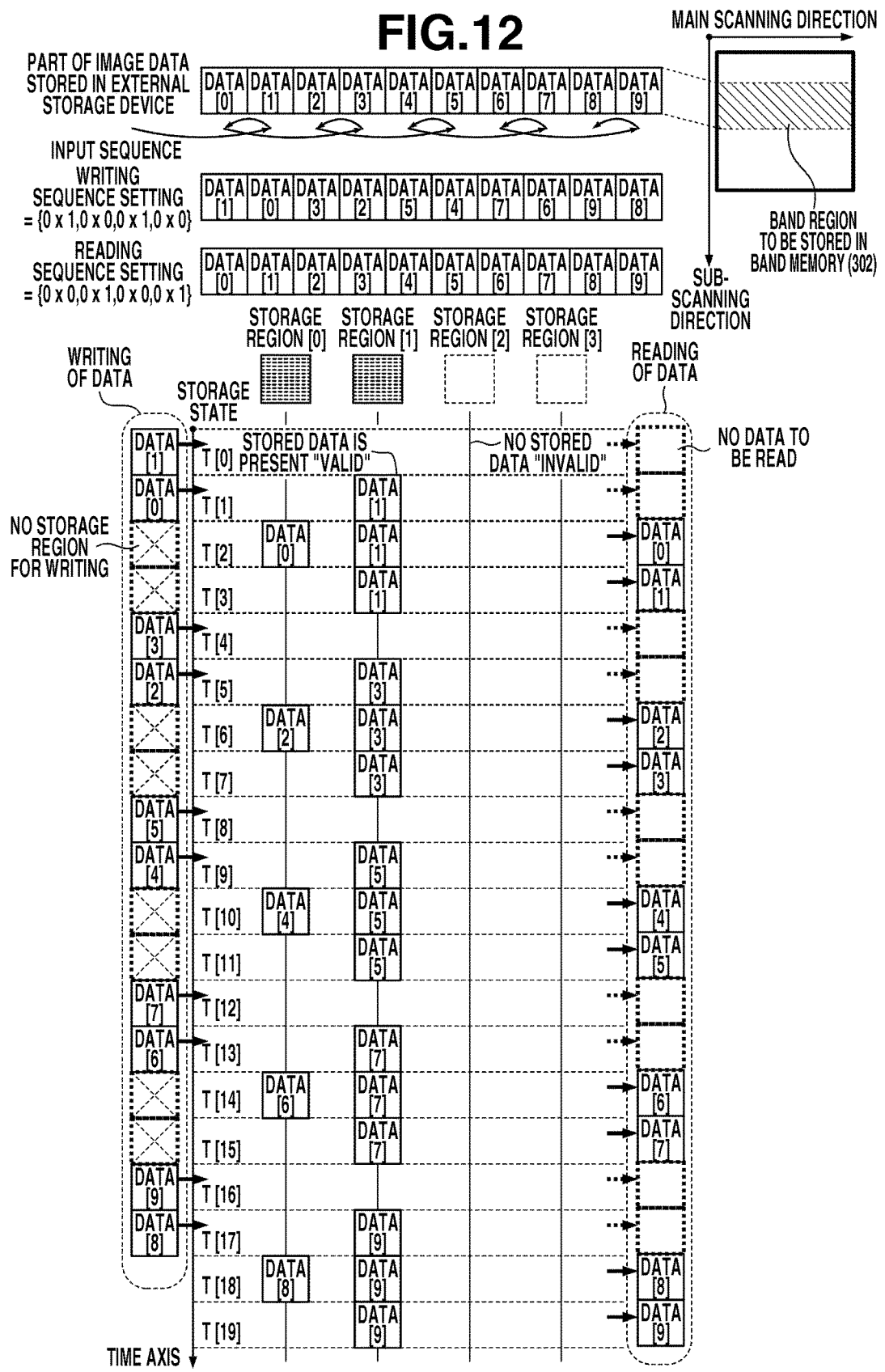
FIG. 12 is a schematic diagram illustrating an operation in data synchronization control in buffering that includes rearrangement.

The operation when four storage regions are used is illustrated in FIG. 11, and the operation when two storage regions are used is illustrated in FIG. 12. When carrying out the image processing while rearranging two pieces of data, two or more storage regions are required, and the rearrangement cannot be carried out with a single storage region. In other words, when rearranging N (N is an integer equal to or greater than 2) pieces of data, N or more storage regions are required. With the configuration illustrated in FIG. 6, the image processing can be carried out while rearranging up to four pieces of data. Here, by increasing the number of storage state retaining registers and the number of sequence setting registers corresponding to the number of storage regions and expanding the storage region selection circuit, the number of pieces of data that can be rearranged can be easily increased.

According to the present exemplary embodiment, the processing can be carried out with the data pieces being rearranged from the order in which the data pieces arrive in accordance with the processing sequence of the image processing unit 150. Through a mechanism realized with the present exemplary embodiment, only by modifying the settings for the data synchronization control device 500, various cases of data rearrangement as described above can be handled flexibly. Accordingly, the present exemplary embodiment can flexibly handle such a case where the processing speed is reduced less if the order in which data is requested from the external storage device is not the same as the order in which the data is processed in the processing device.

Recently, with an increase in processing devices (masters) to be included in a single product, a Network-on-Chip (NoC) is sometimes employed to connect the processing devices. In the NoC, a single processing device (master) is connected to a plurality of transmission paths, and data can be transferred using a transmission path with lighter traffic. However, with this connection mode, the data is not always transferred via the same transmission path, and thus the order in which the data is requested may differ from the order in which the data arrives. Thus, a configuration capable of handling, using a buffer, such a case that the order in which the data arrives differs from the order in which the data is requested in an image processing apparatus with NoC will be described.

Figure 13:
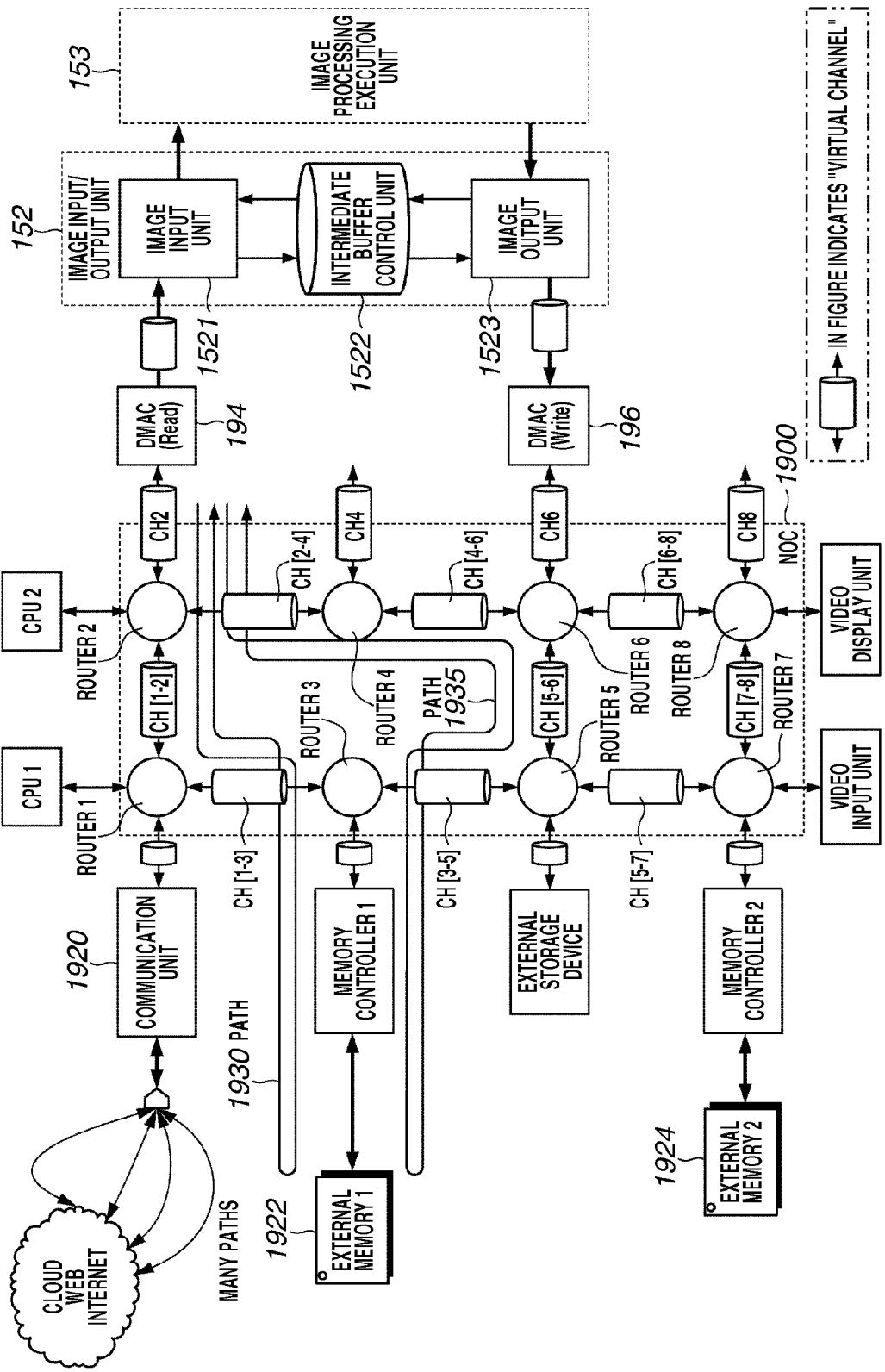
FIG. 13 is a schematic diagram illustrating an overall system that includes an image processing unit, a Network-on-Chip (NoC), and a cloud.

FIG. 13 is a block diagram illustrating an example of an image processing apparatus with NoC according to a second exemplary embodiment. Note that configurations that are similar to those in the first exemplary embodiment are given the same reference characters, and when there is no difference in terms of the functions, the description thereof will be omitted. Although the components are connected using the system bus 190 (common bus) in the configuration illustrated in FIG. 1A, according to the present exemplary embodiment, various components are connected to one another via a virtual channel 1900 that includes routers. In the NoC, a single processing device (master) is connected to a plurality of transmission paths, and data can be transferred using a transmission path with lighter traffic.

For example, when image data is input to the image input unit 1521, the DMAC 194 reads the image data from an external memory 1922. Basically, it is desirable to read the image data using routers and virtual channels in a path 1930 which is the shortest path.

The path 1930: virtual channel CH[2]→router 2→virtual channel CH[1-2]→router 1→virtual channel CH[1-3]→router 3→memory controller 1→external memory 1 (1922)

However, if a CPU 1 and a CPU 2 are reading data from a communication unit 1920 via the internet, the virtual channel CH[1-2] connected to the router 1 and the router 2 experiences heavy traffic. Accordingly, the router 2 bypasses the virtual channel CH[1-2} and reads the image data using a path 1935.

The path 1935: virtual channel CH[2]→router 2→virtual channel CH[2-4]→router 4→virtual channel CH[4-6]→router 6→virtual channel CH[5-6]→router 5 virtual channel CH[3-5]→router 3→memory controller 1→external memory 1 (1922)

Through such a bypass, bus contention can be avoided flexibly in an image processing apparatus with NoC.

However, when such NoC is used, the data is not always transferred via the same transmission path, and thus the order in which the data is requested (by the DMAC 194) may differ from the order in which the data arrives (at the DMAC 194). The second exemplary embodiment can flexibly handle such an issue only by modifying a part of the data synchronization control device 500 of the first exemplary embodiment.

According to the second exemplary embodiment, storage regions of the intermediate buffer 232 are used to wait for image data. In other words, according to the present exemplary embodiment, the writing sequence of data into the intermediate buffer 232 is not important, and thus the functions of the writing sequence setting register 530 and the write access region selection circuit 535 of the data synchronization control device 500 may be stopped. A register (not illustrated) may be provided to configure settings as to whether the writing sequence setting register 530 and the write access region selection circuit 535 are to be functioned.

The image input unit 1521 confirms the availability state ("invalid") in the storage state retaining registers 520 of the data synchronization control device 500 with the setting value in the reading sequence setting register 540 being the order of priority. Image data can be written externally into an available storage region. The image input unit 1521 notifies the DMAC 194 of the number of an available storage region that also accords with the reading sequence as a storage region number (storage region number issuing unit). When the DMAC 194 reads desired image data from an external memory, the DMAC 194 adds the storage region number as attribute information to a read command. The read command is transmitted to a memory controller via a virtual channel and a router. Then, the memory controller reads the desired image data based on the address in the read command and returns the image data along with the storage region number to the DMAC 194. The DMAC 194 inputs the read image data and the storage region number altogether into the image input unit 1521.

The image input unit 1521 writes the image data in the storage region corresponding to the storage region number via the data synchronization control device 500. With the writing of the image data being completed, the writing control unit 550 notifies the synchronization control unit 570 of the completion. With the reading and the writing being both completed, the synchronization control unit 570 (i.e., a first control unit and a second control unit) makes the synchronization signal 572 valid and updates the value of the storage state retaining register. More specifically, the storage state corresponding to the storage region of the above-described storage region number may be updated from "invalid" to "valid."

As described thus far, the second exemplary embodiment can handle the image processing apparatus with NoC including the virtual channels and the routers with relative ease.

According to the present exemplary embodiment, even when the order in which data is requested and the order in which the data arrives cannot be maintained in the same order in a network outside the data synchronization control device 500, the writing sequence of the data synchronization control device 500 can be matched with the data arriving sequence. Further, with the data synchronization control device 500 according to the exemplary embodiments, processing can be carried out with the data pieces being rearranged from the order in which the data pieces arrive in accordance with the processing sequence of the image processing unit 150. Even if the order in which the data is requested, the order in which the data arrives, and the order in which the data is processed differ from one another, the mechanism realized through the exemplary embodiments can flexibly handle such a situation.

In the descriptions above, the band processing (processing belt-shaped divided image data pieces on a piece-by-piece basis) is mainly described. However, the image processing method according to the exemplary embodiments can also be applied to block (tile) processing which is another method for dividing image data into regions. In the block (tile) processing, image data is two-dimensionally divided into regions along the main scanning direction and the sub-scanning direction. For example, the small regions (processing units) described above may correspond to pixel regions obtained by two-dimensionally dividing the image data, and the method for sequentially reading from the first small region to the M-th small region is the block (tile) processing. Further, if there is space in the storage capacity of the RAM 106 and the delay memory in the local (proximal) image processing does not need to be saved, a page's worth of image data 300 may be stored in the RAM 106, and the image processing may be carried out per page. In any case, the data synchronization control device 500 according to the exemplary embodiments can be adopted to control the intermediate buffer 232 for storing the image data.

Further, although the configuration that includes the plurality of DMACs is used in the above-described exemplary embodiments, a DMAC is merely a component for transferring data in place of a CPU. If an increase in a transfer load of the CPU is not an issue, a given DMAC may be deleted, and the processing thereof may be added to a CPU.

Although a printer is used as an example in the above-described exemplary embodiments, aside from the printer, the exemplary embodiments can be applied for various uses such as a raster plotter and a video camera.

Although image data is described in detail in the above-described exemplary embodiments, the exemplary embodiments may be applied to an information processing apparatus that processes data with a sub-system (here, processing system other than the CPU) and may similarly be applied to an apparatus other than an apparatus that processes image data. In that case, the image processing circuits may be configured to process audio data, moving image data, document data, and so forth.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Additional embodiments can also be realized by a computer of a system or apparatus that reads out and executes computer executable instructions recorded on a storage medium (e.g., computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-167044 filed Jul. 27, 2012, which is hereby incorporated by reference herein in its entirety.

What is claimed is:

1. A buffer, comprising:
a memory unit including a plurality of storage regions of a predetermined physical size;
a sequence setting unit configured to set an order of writing and reading from selected storage regions among the plurality of storage regions, wherein each of the selected storage regions is identified with an indicator;
an access region selection unit configured to output a first indicator of at least one of the selected storage regions in the set order of writing and a second indicator of at least one of the selected storage regions in the set order of reading;
a storage region number issuing unit configured to acquire the first indicator and the second indicator of one of the selected storage regions, and issue the first identifier and the second identifier;
a receiving unit configured to receive a part of image data, to be written into the storage region associated with the issued first identifier;
a writing unit configured to write the data received by the receiving unit into the storage region associated with the issued first identifier;
a reading unit configured to read data to be transmitted from the storage region associated with the issued second identifier;
a transmitting unit configured to transmit the data read by the reading unit; and
a control unit configured to control the access region selection unit to output subsequent indicators upon completion of an access to a storage region associated with output indicators by the reading unit
wherein an order of writing to selected storage regions is independent of the order of reading set by the sequence setting unit.

2. The buffer according to claim 1, further comprising a state retaining unit configured to indicate a storage state of each of the plurality of storage regions, wherein the writing unit and the reading unit access a storage region based on a value stored in the state retaining unit.

3. The buffer according to claim 1, wherein, the buffer is configured to output data while rearranging buffered data pieces by N pieces, wherein N is an integer greater than or equal to 2 and the memory unit includes at least N storage regions.

4. The buffer according to claim 1, wherein the memory unit includes a static random access memory (SRAM), and the storage region corresponds to a bank in the SRAM.

5. The buffer according to claim 1, wherein the sequence setting unit is a shift register and is configured to shift a value stored therein by a synchronization signal from the control unit.

6. The buffer according to claim 1, wherein the sequence setting unit includes a plurality of registers and a multiplexer and is configured to select a value stored in the plurality of registers in round robin with the multiplexer to output the selected value.

7. The buffer according to claim 1, wherein the predetermined physical size is related to a band of image data.

8. The buffer according to claim 1, wherein the predetermined physical size is related to a number of pixels.

9. A method for controlling a buffer including a memory unit including a plurality of storage regions of a predetermined physical size, a sequence setting unit configured to set an order of writing and reading from selected storage regions among the plurality of storage regions, wherein each of the selected storage regions is identified with an indicator, an access region selection unit configured to output a first indicator of at least one of the selected storage regions in the set order of writing and a second indicator of at least one of the selected storage regions in the set order of reading, a storage region number issuing unit configured to acquire the first indicator and the second indicator of one of the selected storage regions, and issue the first identifier and the second identifier, a receiving unit configured to receive a part of image data, to be written into the storage region associated with the issued first identifier, a writing unit configured to write the data received by the receiving unit into the storage region associated with the issued first identifier, a reading unit configured to read data to be transmitted from the storage region associated with the issued second identifier, and a transmitting unit configured to transmit the data read by the reading unit, the method comprising:
controlling the access region selection unit to output subsequent indicators upon completion of an access to a storage region associated with output indicators by the reading unit
wherein an order of writing to selected storage regions is independent of the order of reading set by the sequence setting unit.

10. The method according to claim 9, further comprising indicating a storage state of each of the plurality of storage regions and accessing a storage region based on a value stored in the state retaining unit.

11. The method according to claim 9 further comprising outputting data while rearranging buffered data pieces by N pieces, wherein N is an integer greater than or equal to 2.

* * * * *